US011490546B2

United States Patent
Edmunds et al.

(10) Patent No.: US 11,490,546 B2
(45) Date of Patent: Nov. 1, 2022

(54) COOLING SYSTEM FOR ELECTRONIC MODULES

(71) Applicant: ICEOTOPE GROUP LIMITED, South Yorkshire (GB)

(72) Inventors: Neil Edmunds, South Yorkshire (GB); Jason Matteson, South Yorkshire (GB); Nathan Longhurst, South Yorkshire (GB); David Amos, South Yorkshire (GB)

(73) Assignee: ICEOTOPE GROUP LIMITED, South Yorkshire (GB)

( * ) Notice: Subject to any disclaimer, the term of this patent is extended or adjusted under 35 U.S.C. 154(b) by 0 days.

(21) Appl. No.: 17/554,883

(22) Filed: Dec. 17, 2021

(65) Prior Publication Data

US 2022/0110225 A1 Apr. 7, 2022

Related U.S. Application Data

(63) Continuation of application No. 17/611,392, filed as application No. PCT/GB2020/051245 on May 21, 2020.

(30) Foreign Application Priority Data

May 21, 2019 (GB) ...................................... 1907182
Nov. 18, 2019 (GB) ...................................... 1916767

(51) Int. Cl.
*H05K 7/20* (2006.01)
(52) U.S. Cl.
CPC ................................ *H05K 7/20772* (2013.01)
(58) Field of Classification Search
None
See application file for complete search history.

(56) References Cited

U.S. PATENT DOCUMENTS

| | | | | |
|---|---|---|---|---|
| 7,539,020 | B2 * | 5/2009 | Chow | ................. H05K 7/20781 361/759 |
| 7,724,524 | B1 * | 5/2010 | Campbell | .......... H05K 7/20772 165/104.19 |

(Continued)

FOREIGN PATENT DOCUMENTS

| | | |
|---|---|---|
| CN | 108811472 A | 11/2018 |
| WO | 2018135327 A1 | 7/2018 |

(Continued)

OTHER PUBLICATIONS

GB Search Report for App. No. GB1907182.8, dated Oct. 4, 2019, 4 pages.

(Continued)

*Primary Examiner* — Courtney L Smith
(74) *Attorney, Agent, or Firm* — Butzel Long

(57) ABSTRACT

A system and a method for cooling a plurality of electronic devices housed in a housing of an electronic module. The system comprises a first cooling circulatory arrangement, configured to circulate a first liquid coolant between a first electronic device of the plurality of electronic devices and a heat exchanger, the first electronic device being thermally coupled to the first liquid coolant such that heat is transferred from the first electronic device to the first liquid coolant. The system further comprises a second cooling circulatory arrangement, configured to circulate a second liquid coolant between a second electronic device of the plurality of electronic devices and the heat exchanger, the second electronic device being thermally coupled to the second liquid coolant such that heat is transferred from the second electronic device to the second liquid coolant. The first cooling circulatory arrangement and the second cooling circulatory arrangement are thermally coupled at least via the heat (Continued)

exchanger, such that heat is transferred from the first liquid coolant to the second liquid coolant via the heat exchanger.

18 Claims, 24 Drawing Sheets

(56) References Cited

U.S. PATENT DOCUMENTS

| | | | | |
|---|---|---|---|---|
| 8,305,754 B2* | 11/2012 | Wu | ................... | F28D 15/0275 |
| | | | | 361/689 |
| 9,848,514 B2* | 12/2017 | Shelnutt | ................... | G06F 1/20 |
| 10,609,839 B1* | 3/2020 | Archer | ................ | F28D 1/0206 |
| 10,820,450 B2* | 10/2020 | Lyon | ................ | H05K 7/20781 |
| 2007/0297136 A1* | 12/2007 | Konshak | ............ | H05K 7/20781 |
| | | | | 361/699 |
| 2008/0026509 A1 | 1/2008 | Campbell | | |
| 2008/0196867 A1 | 8/2008 | Spearing | | |
| 2009/0238235 A1 | 9/2009 | Campbell | | |
| 2012/0111035 A1* | 5/2012 | Campbell | ............. | F25B 25/005 |
| | | | | 62/190 |
| 2012/0147553 A1 | 6/2012 | Eriksen | | |
| 2014/0211531 A1 | 7/2014 | Yamashita | | |
| 2017/0177007 A1 | 6/2017 | Shelnutt | | |
| 2018/0027695 A1 | 1/2018 | Wakino | | |
| 2018/0160566 A1* | 6/2018 | Branton | ............. | H05K 7/20754 |
| 2019/0226767 A1 | 7/2019 | Omi | | |
| 2019/0320548 A1* | 10/2019 | Gao | ................... | H05K 7/20781 |
| 2021/0321542 A1* | 10/2021 | Edmunds | ........... | H05K 7/20809 |

FOREIGN PATENT DOCUMENTS

| | | |
|---|---|---|
| WO | 2019048864 A1 | 3/2019 |
| WO | 2020234600 A1 | 11/2020 |

OTHER PUBLICATIONS

GB Search Report for App. No. GB1916767.5, dated Apr. 14, 2020, 3 pages.
International Search Report and Written Opinion for App. No. PCT/GB2020/051245, dated Aug. 26, 2020, 14 pages.

* cited by examiner

COOLING SYSTEM FOR ELECTRONIC MODULES

TECHNICAL FIELD OF THE DISCLOSURE

The disclosure concerns a system for cooling a plurality of electronic devices housed in an electronic module. The system comprises a first cooling circulatory arrangement which is arranged to cool a first electronic device within the electronic module, and a second cooling circulatory arrangement arranged to cool a second electronic device within the electronic module. Coolant circulating within the first cooling circulatory arrangement is cooled by transfer of heat, via a heat exchanger, to coolant circulating in the second cooling circulatory arrangement. There is further described a method for cooling a plurality of electronic devices housed in an electronic module.

The disclosure also concerns a system for cooling an electronic module configured for installation into a rack. The disclosure further considers a method of installation of a liquid cooled system for an electronic module, and a kit for use in the installation method.

BACKGROUND TO THE DISCLOSURE

Within computers, servers, or other devices used for data processing (referred to as IT, or Information Technology), are a number of electronic devices called Integrated Circuits (IC). The electronic devices within the integrated circuits may include central processing units (CPUs), Application Specific Integrated Circuits (ASICs), Graphical Processing Units (GPUs), Random Access Memory (RAM), etc. Each of these devices produce heat when in use. In order to maintain the devices at an optimum temperature for correct operation, it is important for this heat to be transferred away from the devices. As the processing power of IT increases and so the number of electronic devices within a computer, server or other IT grows, the challenge of removing sufficient heat created by the electronic devices increases.

The electronic devices, normally mounted on a printed circuit board (PCB), are usually housed or enclosed within a case or chassis, to form an electronic module. For instance, a computer server often comprises a number of electronic modules, mounted in a rack and connected together in order to provide the required IT facilities. A method for removal of heat from each case or chassis is required, in order to maintain the electronic devices within the chassis at an appropriate temperature.

It is common to cool an electronic module by passing air over or through each case or chassis. The flow of air may be sufficient to remove some heat from inside the enclosure, to the surrounding environment. This method of cooling has, until recently, been used almost exclusively for mass-manufactured IT and server equipment. However, it has been found that, as technology size decreases for the same performance, the heat produced by electronic devices is increasing even as the footprint decreases. As such, the peak performance of IT systems has been throttled by the limitations of cooling an electronic module with air cooled systems.

Accordingly, more complex systems and methods for cooling electronic modules have been proposed. In some cases, liquid cooling has been used, in which a liquid coolant is flowed over, or flowed in proximity to a heat sink coupled to, the electronic devices. The heat can then be transferred away from the electronic devices, to an area or element at which the heat can be removed from the liquid coolant.

Liquid cooling can in some cases provide more efficient transfer of heat away from the electronic devices or components, and so a greater cooling power than air cooled systems. However, state of the art liquid cooling systems often required customised systems, which are complex and expensive to install.

Thus, it is an objective of the present invention to provide a system for cooling an electronic module, and furthermore a method of cooling such a system, which overcomes these drawbacks of prior art systems.

SUMMARY OF THE DISCLOSURE

Against this background there is provided a system and method for cooling a plurality of electronic devices housed in a housing of an electronic module. In particular, the system comprises a first and second cooling circulatory arrangement, or first and second cooling loop, each circulating respective first and second liquid coolants. Each of the cooling circulatory systems are used to cool electronic devices of the plurality of devices within an electronic module. However, the second cooling circulatory arrangement is further configured to cool the coolant circulating in the first cooling circulatory system, by exchange of heat between the first and second liquid coolants via a heat exchanger. The first and second cooling circulatory arrangement may have different efficiencies, and so a more efficient cooling provided by the second cooling circulatory arrangement can be used to cool the first liquid coolant. Furthermore, the more efficient second cooling circulatory arrangement can be focussed on specific high power electronic devices (which generate comparatively more heat). The first liquid coolant can be used to maintain a generally lower temperature for the overall environment within the electronic module.

In a preferred example, the second cooling circulatory arrangement can comprise cold plates, which can be thermally coupled to specific electronic devices of the plurality of electronic devices. In comparison, the first cooling circulatory system can circulate a first liquid coolant contained, in part, in a reservoir within the electronic module, wherein a number of the electronic devices are at least partially immersed in the reservoir of the first liquid coolant. Moreover, the inclusion of a weir or bathtub heat sink within the first cooling circulatory system can provide further advantages for the described system and method, as discussed below.

In a first aspect, there is described a system for cooling a plurality of electronic devices housed in a housing of an electronic module, the system comprising:

a first cooling circulatory arrangement, configured to circulate a first liquid coolant between a first electronic device of the plurality of electronic devices and a heat exchanger, the first electronic device being thermally coupled to the first liquid coolant such that heat is transferred from the first electronic device to the first liquid coolant; and a second cooling circulatory arrangement, configured to circulate a second liquid coolant between a second electronic device of the plurality of electronic devices and the heat exchanger, the second electronic device being thermally coupled to the second liquid coolant such that heat is transferred from the second electronic device to the second liquid coolant;

wherein the first cooling circulatory arrangement and the second cooling circulatory arrangement are thermally coupled at least via the heat exchanger, such that heat is transferred from the first liquid coolant to the second liquid coolant via the heat exchanger.

The electronic devices may be any heat generating devices or components, including Integrated Circuits (IC) comprising central processing units (CPUs), Application Specific Integrated Circuits (ASICs), Graphical Processing Units (GPUs), Random Access Memory (RAM), etc. Together the devices may be connected to form a server or other computer processing function, or other IT.

The electronic modules, or server modules, may be a module forming part of a computer server. The electronic module may have a chassis or housing, in which each of the electronic devices are mounted. The electronic module may be configured for mounting or installation into a rack. For instance, the electronic module may conform to the industry standard dimensions required to fit into a standard server rack (known as 1RU (one rack unit) or 1OU (one open unit). Such units may be referred to as a blade server.

The system comprises a first and a second cooling circulatory arrangement (or first and second cooling loop). The cooling circulatory arrangements provide a configuration for flow of a respective first and second coolant through the electronic module.

Specifically, the first cooling circulatory arrangement circulates or flows a first liquid coolant from at least a first electronic, heat generating device (from which heat is absorbed by the first liquid coolant) to a heat exchanger. Heat can be removed from the first liquid coolant at the heat exchanger.

The second cooling circulatory arrangement circulates or flows a second liquid coolant from at least a second electronic, heat generating device (from which heat is absorbed by the second liquid coolant) to the heat exchanger. At the heat exchanger, the heat from the first liquid coolant is received by the second liquid coolant.

Although in some cases the second cooling circulatory arrangement may be closed (in other words, the liquid coolant is recirculated and recycled within the loop), this is not always the case. In alternative cases, the second cooling circulatory arrangement can describe an open loop, in which liquid coolant is received, flowed around the described pathway, and then passed to a drain. For instance, after passing through the heat exchanger the second liquid coolant in the second cooling circulatory arrangement is then either cooled (by passing through a cooling system before passing back to the electronic module), or is replenished (for example, where the second liquid coolant is part of a facility wide coolant supply, such as a facility water supply).

Beneficially, the described system is a hybrid system of two cooling circulatory arrangements. The use of such a hybrid system allows a higher performance, more efficient cooling arrangement to be targeted at particularly high temperature components (the second cooling circulatory arrangement, targeted to at least the second electronic device), as well as using a further cooling arrangement to cool other devices. However, more than simply using two entirely separate cooling systems in parallel, the present inventors have recognised that the return flow of the higher performance cooling arrangement can also be used to remove heat from the other, lower performance cooling arrangement. To some extent, the first cooling circulatory arrangement may be considered to be nested with the second cooling circulatory arrangement.

Optionally, the first liquid coolant is a dielectric liquid, and the second liquid coolant is water. It will be understood that although the term liquid coolant is used herein, any suitable fluid coolant could be used.

Optionally, the second cooling circulatory arrangement further comprises a cooling system, wherein the second cooling circulatory arrangement is configured to circulate the second liquid coolant between the second electronic device of the plurality of electronic devices, the heat exchanger and the cooling system, wherein heat is removed from the second liquid coolant by the cooling system. Preferably, the cooling system is arranged to be external to the electronic module. In other words, the second cooling circulatory arrangement forms a closed loop, in which the second liquid coolant received from the electronic module is cooled by a cooling system, before being returned to the electronic module for cooling the second electronic device.

Alternatively, the second cooling circulatory arrangement is connected to a second liquid coolant supply, wherein the second cooling circulatory arrangement is configured to circulate the second liquid coolant received from the second liquid coolant supply between the second electronic device of the plurality of electronic devices and the heat exchanger, and to be returned to the second liquid coolant supply. In other words, the second cooling circulatory arrangement is an open loop, and the second liquid coolant is fed from a facility level supply, and constantly replenished. For instance, the second liquid coolant supply may be a water supply, from which water is received (as the second liquid coolant), circulated through the second cooling circulatory arrangement, and then allowed to exit the second cooling circulatory arrangement to facility drainage.

Preferably, the heat exchanger comprises at least a first and a second chamber separated by a thermal interface, wherein the heat exchanger is configured for flow of the first liquid coolant through at least the first chamber, and flow of the second liquid coolant through at least the second chamber, such that heat is transferred from the first liquid coolant to the second liquid coolant through the thermal interface. The heat exchanger is a dedicated element configured for exchange of heat between the first and second liquid coolant. Each of the first and the second liquid coolant may pass through one or more dedicated chambers of the heat exchanger, wherein heat can pass from the first to the second liquid coolant via a thermal interface between the chambers. The heat exchanger may be of any suitable design, and may provide a plurality of chambers and a plurality of thermal interfaces, in order to improve the efficiency of heat exchange. Fins or other protrusions may be provided at the thermal interface, to increase the surface area of the thermal interface and promote efficiency of heat exchange between the first and second liquid coolant. Optionally, the heat exchanger is a plate heat exchanger.

Preferably, the heat exchanger is arranged within the housing of the electronic module. In particular, the heat exchanger is contained within the electronic module. This allows at least the first liquid coolant to be entirely retained within the electronic module. This reduces the complexity of connections into and out of the electronic module. It also allows provision of the electronic module as a sealed module, which may be advantageous where the second liquid coolant is a dielectric, and which may be harmful to humans if released from the module, and which may be expensive to replace if leaked or lost.

Optionally, the first cooling circulatory arrangement is contained entirely within the housing of the electronic module. In other words, the first cooling circulatory arrangement is arranged so that the first liquid coolant does not leave the confines of the housing of the electronic module when in normal operation.

The first cooling circulatory arrangement may be at least partially insulated from the second cooling circulatory arrangement, in the portions of the second cooling circulatory arrangement prior to the second liquid coolant circulating to the second electronic device, having the coolest second liquid coolant. The first cooling circulatory arrangement may be at least partially insulated from the second cooling circulatory arrangement, except at the heat exchanger at which the first and second cooling circulatory arrangement are thermally coupled. In other words, the return flow of the second cooling circulatory arrangement (in other words, after receipt of heat from the second electronic device) is used to cool the first liquid coolant. This avoids increasing the temperature of the second liquid coolant before reaching the second electronic device, in order to maximise the cooling power (or more specifically, the temperature gradient) at the second electronic device.

Optionally, the housing of the electronic module contains the first liquid coolant, and the first electronic device is at least partially immersed in the first liquid coolant. In other words, the first cooling circulatory arrangement is an immersion cooling arrangement. Heat may be transferred directly to the first liquid coolant from a surface of the first electronic device that is at least partially immersed in the first liquid coolant. Portions of the second cooling circulatory arrangement, including the second electronic device, may also be at least partially immersed in the first liquid coolant.

In contrast, the second cooling circulatory arrangement may be configured to circulate the second liquid coolant through a cooling module and the heat exchanger, where the cooling module is mounted to the second electronic device at a mounting surface of the cooling module. Therefore, heat is exchanged between the second electronic device and the second liquid coolant indirectly, through the mounting surface of the second cooling module. The cooling module forming part of the second cooling circulatory arrangement is discussed in more detail below.

In a preferred example, the first cooling circulatory arrangement comprises a weir, the weir comprising:

a base and a retaining wall extending from the base, the base and retaining wall defining a volume for holding some of the first liquid coolant;

an inlet, through which the first liquid coolant flows into the volume;

wherein the flow of sufficient first liquid coolant through the inlet into the volume causes the first liquid coolant to overflow the retaining wall and collect with first liquid coolant contained in the housing of the electronic module and exterior the weir.

The base and retaining walls may provide a container or 'bath tub' from which the first coolant may overflow. The weir may be coupled to the surface of a first electronic device, in order to act as a heat sink for the first electronic device. Thus, the weir provides a volume for holding or retaining liquid coolant against the heat-generating electronic device. Alternatively, or in addition, the weir may be mounted on a PCB that is raised compared to other components in the electronic device, and/or compared to the level of first coolant within the cavity of the housing of the electronic module. In this way, the first liquid coolant then acts to flow over the first electronic device and a number of other electronic devices or components housed in the electronic module, as it overflows the weir.

The weir may be configured to direct the flow of the first liquid coolant circulating through the first cooling circulatory arrangement. In other words, the weir may be configured such that first liquid coolant overflowing the weir flows on to or over specific electronic devices housed within the electronic module. Advantageously, by inclusion of the weir in the first cooling circulatory arrangement the liquid coolant can be applied more effectively to the place or places where the most heat is generated. Less coolant can therefore be used. Since the coolant is expensive and heavy, reducing the quantity of coolant can improve flexibility, efficiency and reliability (for example, since coolant leakages are less likely and because the coolant in the volume can resist instant temperature changes caused by the failure of other components in the system).

In respect of the weir, the volume for holding or retaining the first liquid coolant can be defined by a base and a retaining wall (which may be integral or separate). The base is the part of the weir which may be mounted on top of an electronic device (more specifically, a heat-transmitting surface of an electronic device) and transfers heat from the heat-transmitting surface. The base typically has a planar surface defining the volume (and the base itself may be planar in shape). Heat transferred (typically conducted) through the base (in particular its surface defining the volume) is transferred to the liquid coolant held in the volume. The retaining wall extends from the base.

One effect of the weir is to raise the level of the coolant held within the weir's volume above that external the volume (at least when the cooling module is operated with the plane of the electronic device and/or circuit board horizontal) and the quantity of coolant within the container of the cooling module lower than the height of the retaining wall.

Advantageously, the heat sink has projections (such as pins and/or fins) extending from the base (or less preferably, from the retaining wall) within the volume. The projections may cause the liquid coolant to spread in a radial direction away from a predetermined point on a surface of the base (for example coincident with a hottest part of the electronic device). In particular, the projections may be formed in a non-linear pattern.

Preferably, the inlet to the weir further comprises a nozzle arrangement, for directing the first liquid coolant flowing into the volume. The nozzle arrangement may comprise one or more nozzle (which may be push-fit), each of which directs the flowing or pumped first liquid coolant to a respective part of the volume of the weir, particularly a part of the weir's base. The one or more nozzle may each be arranged in the base, in the retaining wall or arranged over the top of the volume to cause first liquid coolant to flow into the volume. For instance, each nozzle may direct the flowing or pumped liquid coolant to a respective part of the volume of the weir adjacent a part of a heat-transmitting surface of an electronic device having a maximum temperature or a temperature above a threshold level (that is, one of the hottest parts of the device). Most preferably, the nozzle arrangement directs the flowing or pumped liquid coolant in a direction perpendicular to the base of the weir. This may force the coolant directly into the volume and improve heat dissipation.

Preferably, the first cooling circulatory arrangement further comprises a pump configured to circulate the first liquid coolant around the first cooling circulatory arrangement. The pump may be arranged to receive first liquid coolant from the reservoir of liquid coolant contained within the electronic module, and in which at least the first electronic device is at least partially immersed. The pump may then move the received first liquid coolant to another region of the electronic module, for instance to the heat exchanger, and then onwards to the inlet of the weir. The pump may be at least partially immersed in the first liquid coolant, the first liquid coolant thereby also assisting in the cooling of the pump.

The first cooling circulatory arrangement may further comprise a pump inlet, arranged to receive first liquid coolant contained in the housing of the electronic module and exterior the weir. In other words, first liquid coolant contained within the electronic module may be received by the pump inlet, to be passed to the pump.

Preferably, the first cooling circulatory arrangement further comprises at least a first and a second pipe, arranged to transport the first liquid coolant from the pump to the heat exchanger and the from the heat exchanger to the inlet of the weir, respectively.

Preferably, the second cooling circulatory arrangement further comprises a cooling module configured to thermally couple the second electronic device to the second liquid coolant. The cooling module may be a specific component for efficient heat transfer from the second electronic device to the second liquid coolant. The cooling module may be mounted to the second electronic device via a mounting surface of the cooling module, so that heat is transferred from the second electronic device to the second liquid coolant through the mounting surface.

Preferably, the cooling module comprises a cold plate, the cold plate comprising:

a cold plate housing, a surface of the cold plate housing being arranged to provide a thermal interface for cooling the second electronic device which is thermally coupled thereto; and at least one channel within the cold plate housing and proximate to the surface of the cold plate housing, the at least one channel arranged for the second liquid coolant to flow therethough such that heat received from the second electronic device through the surface of the cold plate housing is transferred to the second liquid coolant.

Advantageously, the cold plate provides an efficient and effective mechanism for cooling specific electronic devices in the electronic module. The cold plate provides high performance cooling for the second electronic device to which it is thermally coupled. Therefore, the cold plate can be coupled to the hottest component or components within the electronic module, in order to provide the greatest cooling power to these components.

Optionally, the surface of the cold plate housing may be directly coupled to a surface of the second electronic device. Alternatively, the housing may be coupled by a further interfacing surface or component. Nevertheless, the cold plate and the second electronic device will be thermally coupled, to promote effective and efficient heat transfer from the second electronic device to the second liquid coolant.

More than one cold plate may be arranged in the electronic module, as part of the second cooling circulatory arrangement. Two or more cold plates may be arranged in the second cooling circulatory arrangement in parallel or in series, or where three or more cold plates are used, a combination of parallel and series configurations could be implemented.

Preferably, the second cooling circulatory arrangement comprises a plurality of conduits arranged to transport the second liquid coolant between the cold plate and the heat exchanger, as well as for connection to any cooling system or coolant supply that is external to the electronic module.

In a second aspect, there is described a method for cooling a plurality of electronic devices housed in a housing of an electronic module, the method comprising:

circulating a first liquid coolant around a first cooling circulatory arrangement, comprising circulating a first liquid coolant between a first electronic device of the plurality of electronic devices and a heat exchanger, the first electronic device being thermally coupled to the first liquid coolant such that heat is transferred from the first electronic device to the first liquid coolant; and circulating a second liquid coolant around a second cooling circulatory arrangement, comprising circulating a second liquid coolant between a second electronic device of the plurality of electronic devices and the heat exchanger, the second electronic device being thermally coupled to the second liquid coolant such that heat is transferred from the second electronic device to the second liquid coolant;

wherein the first cooling circulatory arrangement and the second cooling circulatory arrangement are thermally coupled at least via the heat exchanger, such that heat is transferred from the first liquid coolant to the second liquid coolant via the heat exchanger.

In other words, the method may comprise circulating a first liquid coolant around a first cooling circulatory arrangement, and circulating a second liquid coolant around a second cooling circulatory arrangement. Each of the first and second cooling circulatory arrangements are configured to cool at least respective first and second electronic devices. Moreover, the second cooling circulatory arrangement is arranged such that the second liquid coolant receives heat transferred from the first liquid coolant at a heat exchanger. Advantageously, this hybrid cooling system provides the benefits of a high performance cooling system in relation to the hottest components (the second cooling circulatory arrangement, targeting the first electronic device), but then uses a further cooling system for cooling the other components in the electronic module. In particular, it may not be practical to mount a targeted cooling system (such as provided by the second cooling circulatory arrangement) to every component within the electronic module, and so the first cooling circulatory arrangement may provide an additional cooling system for the remaining components and to lower the temperature of the general environment within the electronic module. Moreover, the return flow of the high performance second cooling circulatory arrangement can itself also be utilised to remove heat from the first cooling system.

It will be understood that the features discussed above with respect to the system, can also be considered to be disclosed in use of the method for cooling the plurality of electronic devices housed in the housing of the electronic module.

In particular, preferably, the second cooling circulatory arrangement further comprises a cooling system, wherein the circulating the second liquid coolant around the second cooling circulatory arrangement comprises circulating the second liquid coolant between the second electronic device of the plurality of electronic devices, the heat exchanger and the cooling system, where heat is removed from the second liquid coolant by the cooling system. The cooling system may be external to the electronic module, and configured to transfer heat out of the second liquid coolant. For instance, the cooling system may comprise a heat exchanger to transfer heat to a further (third) coolant liquid or medium.

Alternatively, the second cooling circulatory arrangement further comprises a second liquid coolant supply, wherein the circulating the second liquid coolant around the second cooling circulatory arrangement comprises receiving the second liquid coolant from the second liquid coolant supply, circulating the second liquid coolant between the second electronic device of the plurality of electronic devices and the heat exchanger, to then be returned to the second liquid coolant supply. For instance, the second liquid coolant may be water, and the second cooling circulatory arrangement may be connected to a facility water supply. Once the water is circulated through the second cooling circulatory arrangement, it may be allowed to pass into a drainage system (and so would not be recirculated through the second cooling circulatory arrangement).

The heat exchanger may comprise at least a first and a second chamber separated by a thermal interface, wherein the heat exchanger is configured for flow of the first liquid coolant through at least the first chamber, and flow of the second liquid coolant through at least the second chamber, such that heat is transferred from the first liquid coolant to the second liquid coolant through the thermal interface. The heat exchanger is a specific element configured for efficient transfer of heat between the first and second liquid coolant. The heat exchanger may be of any suitable design to allow the flow of the first and second liquid coolant therethrough and to exchange heat therebetween. Optionally the heat exchanger is a plate heat exchanger.

Preferably, the heat exchanger is arranged within, or contained within, the housing of the electronic module. Beneficially, this avoids the first liquid coolant from passing out of the electronic module. This both reduces the complexity of connections at the housing of the electronic module, and also reduces the risk for leaks or loss of the first liquid coolant.

Preferably, the first cooling circulatory arrangement and the second cooling circulatory arrangement are thermally coupled via the heat exchanger on the return flow of the second cooling circulatory arrangement. In other words, the first cooling circulatory arrangement and the second cooling circulatory arrangement are thermally coupled via the heat exchanger so that the second liquid coolant passes through the heat exchanger after receiving heat from the second electronic device (when considering the coolest second liquid coolant to be found at the start of the second cooling circulatory arrangement). The first cooling circulatory arrangement may be at least partially insulated from the second cooling circulatory arrangement, prior to the heat exchanger. This provides the greatest possible temperature gradient between the second liquid coolant and the second electronic device.

Preferably, the housing of the electronic module contains the first liquid coolant, and wherein the first electronic device is at least partially immersed in the first liquid coolant. In other words, the housing of the electronic device contains a reservoir of the first liquid coolant, in which at least the first electronic device is at least partially immersed. Heat is therefore transferred directly to the first liquid coolant from a surface of the first electronic device that is at least partially immersed in the first liquid coolant.

Preferably the first cooling circulatory arrangement may comprise a weir. The weir may comprise:
a base and a retaining wall extending from the base, the base and retaining wall defining a volume for holding some of the first liquid coolant;
an inlet, through which the first liquid coolant flows into the volume;
wherein flowing sufficient first liquid coolant through the inlet into the volume causes the first liquid coolant to overflow the retaining wall and collect with first liquid coolant contained in the housing of the electronic module and exterior the weir.

Advantageously, the weir acts to promote flow of the first liquid coolant within the electronic module. The weir may further be arranged to direct the flow of the first liquid coolant circulating through the first cooling circulatory arrangement to specific electronic components.

In a particularly preferred example, the base of the weir may be thermally coupled to the first electronic device. In this way, the weir acts as an effective heat sink for the first electronic device. The weir also maintains a flow of first liquid coolant which may cool heat generating components arranged around the first electronic device to which the weir is coupled.

The inlet may further comprise a nozzle arrangement for directing the first liquid coolant flowing into the volume. The nozzle arrangement comprises one or more nozzle.

The weir may further comprise projections extending from the base and/or retaining wall within the volume of the weir.

The method may further comprise providing a pump within the first cooling circulatory arrangement, the pump configured to circulate the first liquid coolant around the first cooling circulatory arrangement. The first cooling circulatory arrangement may further comprise a pump inlet, for receiving first liquid coolant contained in the housing of the electronic module and exterior the weir.

The method may further comprise providing a plurality of pipes within the first cooling circulatory arrangement, arranged to transport the first liquid coolant from the pump to the heat exchanger and the from the heat exchanger to the inlet of the weir, respectively.

Preferably, the method comprises providing a cooling module within the second cooling circulatory arrangement, configured to thermally couple the second electronic device to the second liquid coolant. The cooling module may be mounted or coupled to a surface of the second electronic device. The cooling module may provide a mechanism for indirect transfer of heat from the second electronic device to the second liquid coolant, via the cooling module (in other words, the second liquid coolant does not make direct contact with surfaces of the second electronic device, but instead heat is transferred from the second electronic device through a portion of the cooling module, to be received at the second liquid coolant). The cooling module may provide a higher cooling power, and assist in more efficient cooling of the second electronic device than could otherwise be provided by the first cooling circulatory arrangement.

In a preferred example, providing the cooling module within the second cooling circulatory arrangement comprises providing a cold plate, the cold plate comprising:
a cold plate housing, a surface of the cold plate housing being arranged to provide a thermal interface for cooling the second electronic device which is thermally coupled thereto; and
at least one channel within the cold plate housing and proximate to the surface of the cold plate housing, the at least one channel arranged for the second liquid coolant to flow therethough such that heat received from the second electronic device through the surface of the cold plate housing is transferred to the second liquid coolant.

More than one cold plate can be provided, which may be arranged in parallel or in series within the second cooling circulatory arrangement. The surface of the cold plate housing may be directly coupled to a surface of the second electronic device, or may be coupled via an interface to promote effective heat transfer.

The method may further comprise providing, within the second cooling circulatory arrangement, a plurality of conduits or pipes arranged to transport the second liquid coolant between the cold plate, the heat exchanger and the cooling system.

In a still further aspect, there is described a system for cooling an electronic module (or server module), configured for installation into a rack (or server rack). The system comprises at least a first and second cold plate (or cold plate module, or cold plate assembly) mounted within the electronic module, through which liquid coolant (which may be water, for instance, or a dielectric fluid) circulates in a cooling loop. The first and second cold plate are each arranged on separate, parallel branches of the cooling loop. During circulation of the liquid coolant through the cold plate, heat is transferred to the liquid coolant passing through each of the first and second cold plates from one or more electronic devices thermally coupled to the cold plates. A cooling system is connected within the cooling loop, in order to remove heat or transfer heat away from the liquid circulating in the cooling loop. The cooling liquid may be arranged either outside or inside the chassis or housing of the electronic module.

In a further aspect there is a system for cooling an electronic module configured for installation into a rack, comprising a first and a second cold plate, mounted within a module housing of the electronic module. Each cold plate comprises a housing, wherein a surface of the housing is arranged to provide a thermal interface for cooling an electronic device thermally coupled thereto. Each cold plate further comprises at least one channel within the housing and proximate to the surface, arranged for a liquid coolant to flow therethough such that heat received by the thermal interface is transferred to the liquid coolant. The first and second cold plates of the system are coupled in parallel in a cooling loop, the cooling loop arranged to circulate the liquid coolant.

Preferably, the system further comprises a cooling system, the cooling system configured to remove heat from the liquid coolant, and a plurality of conduits, coupled to the first and second cold plate and the cooling system for transferring the liquid coolant circulating in the cooling loop between the first and second cold plate and the cooling system. The conduits may be pipes or tubing, which preferably are flexible in order to allow arrangement of the conduits around components within the electronic module. The pipes may be of a small bore size or diameter (for instance between 2 to 20 mm, and more preferably 3 to 10 mm), to assist with arrangement within an existing configuration of components within the electronic module. This is also beneficial, to allow feedthrough of the pipes or tubes through existing holes, openings or apertures in the module housing or chassis, The cooling system may comprise at least a heat exchanger, for transfer of heat from the liquid coolant to another cooling medium (such as a second liquid coolant, or air). The cooling system may be arranged within the housing or chassis of the electronic module, or may be arranged outside of the module.

Preferably, the plurality of conduits comprises at least a first input conduit coupled to the first cold plate, a second input conduit coupled to the second cold plate, a supply conduit, to which the first and the second input conduit are coupled in parallel, a first output conduit coupled to the first cold plate, a second output conduit coupled to the second cold plate, and a receiving conduit, to which the first and the second output conduits are coupled in parallel. In other words, the plurality of conduits comprises at least a conduits forming the first and second parallel branches of the cooling loop (the first input and output conduit, and the second input and output conduits, respectively), and two further conduits to supply or receive liquid coolant to the parallel branches of the cooling loop.

The coupling between the first and the second input conduit and the supply conduit and the coupling between the first and the second output conduit and the receiving conduit may both be arranged within the module housing. In this case, the supply conduit and the receiving conduit are arranged to pass through an opening in the wall of the module housing. Alternatively, the coupling between the first and the second input conduit and the supply conduit, and the coupling between the first and the second output conduit and the receiving conduit may be arranged outside of the module housing. In this case the first and the second input conduit and the first and the second output conduit are arranged to pass through an opening in the wall of the module housing.

Optionally, the system further comprises a manifold for coupling the first and the second input conduit to the supply conduit and/or for coupling the first and the second output conduit to the receiving conduit. Optionally, the system comprises a manifold, for coupling the supply conduit to a first further conduit of the plurality of conduits, and/or for coupling the receiving conduit to a second further conduit of the plurality of conduits. The manifold may be a unit for joining or coupling the conduits. Beneficially, the manifold may provide a coupling that this more robust. The manifold may be a single unit for coupling the input conduits and the supply conduit as well as the output conduits and receiving conduit (with appropriate partition). However, two manifolds may be used, each associated with the supply and receiving side of the cooling loop.

The system may comprise at least one connector for connection of the first and the second input conduit and/or the first and the second output conduit to the manifold. The system may comprise at least one connector for connection of the supply conduit and/or the receiving conduit to the manifold. Any type of suitable connector may be used for connection of the conduits to the manifold. In one example, drip-free, manual connectors are used, which require direct manual manipulation by an installer. In a further example, blind mate connectors may be used, which are push fit connectors not requiring specific manipulation to fit together and seal the connectors. Manually connected drip free connectors advantageously can connect with existing IT, as the tubes can exit the module housing wherever there is an opening or aperture. Blind mate connectors would require a bespoke bracket for the each electronic module, but may provide an easier fit.

In one example, the system may comprise a bracket for securing the manifold to the module housing. In a further example, the system may comprise a bracket for securing the manifold to the rack. The mounting of the manifold to the electronic module to the rack may be chosen according to the space available in the rack, and the requirements of the system. Connection of the manifold to the electronic module may reduce movement and strain on the connections between conduits. However, connection of the manifold to the rack may be more compact, and less likely to be knocked or encounter accidental damage.

In a particular advantageous example, the manifold may be mounted to the rack within a duct defined in the rack for passage of cables connected to the electronic module. As noted above, the electronic modules and racks typically conform to industry standards. Commonly, the racks include a rear cavity, portion or duct through which electronic and data cables can be housed or passed, before connection to an individual electronic module. This cavity or duct can be used to house the one or more manifold, mounted within. This provides a more robust system, and the manifolds are protected and partially enclosed by the duct. The walls of the duct also provides a suitable fixing point for the manifolds (especially as the duct will typically include existing apertures of holes for feed through or fixture of cables).

Preferably, the system comprises a third cold plate, the third cold plate coupled in series with either the first or the second cold plate within the cooling loop. In fact, the system can comprise more than three or any number of cold plates. In particular, the system may include two or more cold plates on each parallel branch of the cooing loop. For instance, the first parallel branch of the cooling loop may comprise a single first cold plate, and a second parallel branch of the cooling loop may comprise a second and a third cold plate, where the second and third cold plates are themselves arranged in series. More than two cold plates may be arranged in series on each parallel branch of the cooling loop.

Moreover, more than two parallel branches of the cooling loop may be arranged within the electronic module, each parallel branch having one or more cold plates connected thereon. If more than one cold plate is arranged on a particular parallel branch of the cooling loop, then the additional cold plates may be arranged in series on the given branch.

Advantageously, the described system can allow circulation of liquid coolant through cold plates either individually, or in groups, in parallel or in series, or as a mixture of both, for instance.

In a further aspect, there is described a method for cooling an electronic module configured for installation into a rack, comprising circulating a liquid coolant around a cooling loop, wherein a first and second cold plate are coupled in parallel within the cooling loop, and wherein the first and the second cold plate are housed within a module housing of the electronic module. Each of the first and the second cold plates comprise a housing, a surface of the housing being arranged to provide a thermal interface for cooling an electronic device thermally coupled thereto, and at least one channel within the housing and proximate to the surface, arranged for the liquid coolant to flow therethough such that heat received by the thermal interface is transferred to the liquid coolant. Each of the features mentioned within this disclosure with reference to the system for cooling may be implemented via the method for cooling of this present aspect.

The cooling system described within the present disclosure may be fitted within typical or standard electronic modules (or server modules), of the type configured for installation in a rack (or server rack). In particular, the described cooling system can advantageously be retro-fitted into existing electronic modules (or panels of server modules within a server rack). The described cooling system can be used to replace existing cooling systems, such as the air cooled system typical within common, or mass manufactured server modules. Such air cooled systems generally include an air cooled heat sink within the chassis of the server module, and this can be removed and replaced by the cold plates described as part of the cooling system of the present disclosure. As such, the 'foot print' (or dimensions of each cold plate in the plane of the server module, e.g. 50 mm×50 mm to 150 mm×150 mm) may be the same or similar to that of typical air cooled heat sinks used in this type of server module.

Advantageously, the presently disclosed cooling system based on liquid cooled cold plates is more efficient and provides a greater cooling power than the air-cooled systems it is intended to replace. Provision of a more efficient cooling system for an electronic module or server module allows for a greater number of components to be included in a particular electronic module (thus improving space efficiency) and/or for the components within the electronic module to be operated at a higher power rate of performance. In particular, use of the described cold plates (and cooling system) can allow operation of components within the electronic modules (such as CPU's) at a higher rate for longer, as the described system is more effective at removing heat. As such, provision of the described cooling system removes some of the limitations presently imposed on computing performance and use of space in electronic modules or server modules, as a result of the challenges for sufficient cooling seen in prior art systems.

Accordingly, it is particularly beneficial to retrofit the cooling system described in the present disclosure within to existing electronic modules which previous utilised an alternative cooling system. As such, in a still further aspect there is provided a method of installation of a liquid cooled system for an electronic module configured for installation into a rack, comprising removing an air cooled heat sink contained within a module housing of the electronic module, mounting a cold plate within the module housing, in the former position of the air cooled heat sink, coupling an input conduit to the inlet cooling port of the cold plate, coupling an output conduit to the outlet cooling port of the cold plate, and connecting the input and the output conduits within a liquid coolant fluid loop, such that liquid coolant circulated around the liquid coolant fluid loop is passed through at least the input conduit, through the cold plate, and through the output conduit. Each cold plate may comprise a housing, a surface of the housing being arranged to provide a thermal interface for cooling an electronic device thermally coupled thereto at least one channel within the housing and proximate to the surface, arranged for a liquid coolant to flow therethough such that heat received by the thermal interface is transferred to the liquid coolant, an inlet coolant port extending outside the housing, for transferring liquid coolant to the at least one channel and an outlet coolant port extending outside the housing, for transferring liquid coolant from the at least one channel. In will be understood that more than one cold plate could be fitted according to this method. In particular, two or more air cooled heat sinks could be removed from an electronic module and replaced by respective two or more cold plates. The two or more cold plates could be fitted and arranged in parallel within the cooling loop (as discussed in above aspects), or alternatively could be arranged in series in the cooling loop.

Preferably, the method further comprises arranging the input and output conduits to pass through an opening in a wall of the module housing.

Preferably, connecting the input and the output conduits within a liquid coolant fluid loop may comprise coupling the input conduit to a first exit port of a manifold, coupling the output conduit to a first entrance port of the manifold, coupling a supply conduit to a second entrance port of the manifold, for transferring liquid coolant to the manifold from a heat exchanger, and coupling a receiving conduit to a second exit port of the manifold, for transferring liquid coolant from the manifold to the heat exchanger.

Optionally, the method further comprises securing the manifold to the rack. In one example, securing the manifold to the rack comprises securing the manifold within a duct defined in the rack for passage of cables connected to the electronic module.

The method may further comprise connecting a heat exchanger between the supply conduit and the receiving conduit, the heat exchanger configured to transfer heat out of the liquid coolant. The method may also comprise connecting a pump between the supply conduit and the receiving conduit, the pump configured to circulate the liquid coolant around the liquid coolant fluid loop.

Alternatively, for instance when a manifold is not present within the cooling loop, the heat exchanger may be connected between the input conduit and the output conduit. Similarly, the pump may be connected between the input conduit and the output conduit. This example may be used where the full cooling loop resides within the module housing of the electronic module. Therefore, the pump, the cooling system (or heat exchanger) and the cold plates are all within the module housing. The cooling system can be used to transfer heat out of the liquid coolant in the cooling loop to another medium (such as a second cooling loop arranged to pass through the housing.

In a yet still further aspect, there is disclosed a kit for use in the method of installation described above. The kit may comprise the at least one cold plate, a first pipe, for use as the input conduit, and a second pipe, for use as the second conduit. The kit may comprise any of the component described above in relation to other aspects, for instance. Options, characteristics and benefits noted above with respect to each component apply to this aspect.

Preferably, the inlet and the outlet coolant ports of the cold plate each comprise an independently rotating fluid connector, thereby allowing adjustment in the direction of the first or the second pipe coupled to the respective coolant port.

Preferably, the cold plate further comprises pins and/or fins arranged within the at least one channel. Optionally, the pins and/or fins are arranged to extend from a bottom surface of the at least one channel that is proximate the surface of the housing arranged to provide the thermal interface to a top surface of the at least one channel that is distal the surface of the housing arranged to provide the thermal interface.

Preferably, the kit further comprises a manifold for connection of the input and the output conduits within the liquid coolant fluid loop, the manifold comprising a first entrance port, for coupling to the output conduit, a first exit port, for coupling to the input conduit a second entrance port, for receiving liquid coolant at the manifold through a supply conduit, and a second exit port, for transferring liquid coolant from the manifold though a receiving conduit. Optionally, two separate manifolds can be provided, for instance for coupling of the input conduit to the supply conduit, and for coupling of the output conduit to the receiving conduit, respectively, the two manifold having appropriate ports.

Optionally, the manifold is configured to be secured to the rack, and more preferably secured to the rack within a duct defined in the rack for passage of cables for connection to the electronic module.

The kit may further comprise a heat exchanger and or a pump. The heat exchanger and/or pump may be for connection between the supply conduit and the receiving conduit, or for connection between the supply conduit and the receiving conduit, depending on the arrangement of the cooling loop.

In a still further example, there is a system for cooling an electronic module configured for installation into a rack, comprising: a first cooling loop, through which a first liquid coolant is circulated, the first coolant loop comprising at least one cold plate; a second cooling loop, through which a second liquid coolant is circulated; a cooling system for transfer of heat from the first liquid coolant to the second liquid coolant; wherein the first coolant loop and the cooling system are contained within a housing of the electronic module.

The first and second cooling loop may be considered a first and second cooling circulatory arrangement, respectively. Beneficially, the described configuration allows the first liquid coolant, which circulates through the at least one cold plate, to be kept entirely within the electronic module (i.e. enclosed within the housing or chassis of the electronic module). As such, when the electronic module is installed or uninstalled from the rack, no connections or disconnections are required to the first coolant loop—the first coolant loop is a 'closed loop' throughout the installation process. Accordingly, the risk of leakage or loss of expensive and sometimes toxic coolant fluid can be reduced or avoided. Moreover, a different type of coolant fluid (for example, more expensive, dielectric liquid) can be used as the first liquid coolant, with a second, more abundantly available fluid (for instance, water) as the second liquid coolant. Use of water as a second liquid coolant can be helpful to allow a large flow rate and provide increased cooling power, but advantageously, the described configuration can maintain the second liquid coolant at a distance from any electrical components or electronic device housed within the chassis.

Preferably, each cold plate comprises: a housing, a surface of the housing being arranged to provide a thermal interface for cooling an electronic device thermally coupled thereto; and at least one channel within the housing and proximate to the surface, arranged for the first liquid coolant to flow therethough such that heat received by the thermal interface is transferred to the first liquid coolant.

Optionally, the first coolant loop comprises a first and a second cold plate, mounted within the housing of the electronic module, the first and second cold plates coupled in parallel in the first cooling loop.

Preferably, the first cooling loop further comprises a pump, for circulation of the first liquid coolant around the first cooling loop, the pump housed within the housing or chassis of the electronic module.

Preferably, the cooling system is a heat exchanger. Optionally, the cooling system is a first cooling system, and the second cooling loop further comprises a second cooling system, for transferring heat out of the second liquid coolant.

Preferably, the second cooling loop further comprises a pump, for circulation of the second liquid coolant around the second cooling loop.

The following numbered clauses show illustrative examples only:

1. A system for cooling an electronic module configured for installation into a rack, comprising:

a first and a second cold plate, mounted within a module housing of the electronic module, each cold plate comprising:

a housing, a surface of the housing being arranged to provide a thermal interface for cooling an electronic device thermally coupled thereto; and at least one channel within the housing and proximate to the surface, arranged for a liquid coolant to flow therethough such that heat received by the thermal interface is transferred to the liquid coolant;

wherein the first and second cold plates are coupled in parallel in a cooling loop, the cooling loop arranged to circulate the liquid coolant.

2. The system of clause 1, further comprising:
   a cooling system, the cooling system configured to remove heat from the liquid coolant; and
   a plurality of conduits, coupled to the first and second cold plate and the cooling system for transferring the liquid coolant circulating in the cooling loop between the first and second cold plate and the cooling system.

3. The system of clause 2, wherein the cooling system comprises a heat exchanger for transfer of heat from the liquid coolant to a further cooling medium.

4. The system of clause 2 or clause 3, wherein the plurality of conduits comprises at least:
   a first input conduit coupled to the first cold plate,
   a second input conduit coupled to the second cold plate,
   a supply conduit, to which the first and the second input conduit are coupled in parallel;
   a first output conduit coupled to the first cold plate;
   a second output conduit coupled to the second cold plate; and
   a receiving conduit, to which the first and the second output conduits are coupled in parallel.

5. The system of clause 4, wherein the coupling between the first and the second input conduit and the supply conduit is arranged within the module housing;
   the coupling between the first and the second output conduit and the receiving conduit is arranged within the module housing; and
   the supply conduit and the receiving conduit are arranged to pass through an opening in the wall of the module housing.

6. The system of clause 4, wherein the coupling between the first and the second input conduit and the supply conduit is arranged outside of the module housing;
   the coupling between the first and the second output conduit and the receiving conduit is arranged outside of the module housing; and
   the first and the second input conduit and the first and the second output conduits are arranged to pass through an opening in the wall of the module housing.

7. The system of clause 4 or clause 6, further comprising a manifold, for coupling the first and the second input conduit to the supply conduit and/or for coupling the first and the second output conduit to the receiving conduit.

8. The system of clause 7, further comprising at least one connector for connection of the first and the second input conduit and/or the first and the second output conduit to the manifold.

9. The system of any one of clauses 4 to 6, further comprising a manifold, for coupling the supply conduit to a first further conduit of the plurality of conduits, and/or for coupling the receiving conduit to a second further conduit of the plurality of conduits.

10. The system of clause 9, further comprising at least one connector for connection of the supply conduit and/or the receiving conduit to the manifold.

11. The system of any one of clauses 7 to 10, further comprising a bracket for securing the manifold to the module housing.

12. The system of any one of clauses 7 to 11, further comprising a bracket for securing the manifold to the rack.

13. The system of clause 12, wherein the manifold is configured to be secured to the rack within a duct defined in the rack for passage of cables connected to the electronic module.

14. The system any preceding clause, further comprising a third cold plate, the third cold plate coupled in series with either the first or the second cold plate within the cooling loop.

15. A method for cooling an electronic module configured for installation into a rack, comprising:
   circulating a liquid coolant around a cooling loop, wherein a first and second cold plate are coupled in parallel within the cooling loop, and wherein the first and the second cold plate are housed within a module housing of the electronic module, and further wherein each of the first and the second cold plate comprises:
      a housing, a surface of the housing being arranged to provide a thermal interface for cooling an electronic device thermally coupled thereto; and
      at least one channel within the housing and proximate to the surface, arranged for the liquid coolant to flow therethough such that heat received by the thermal interface is transferred to the liquid coolant.

16. A method of installation of a liquid cooled system for an electronic module configured for installation into a rack, comprising;
   removing an air cooled heat sink contained within a module housing of the electronic module;
   mounting a cold plate within the module housing, in the former position of the air cooled heat sink, the cold plate comprising:
      a housing, a surface of the housing being arranged to provide a thermal interface for cooling an electronic device thermally coupled thereto;
      at least one channel within the housing and proximate to the surface, arranged for a liquid coolant to flow therethough such that heat received by the thermal interface is transferred to the liquid coolant;
      an inlet coolant port extending outside the housing, for transferring liquid coolant to the at least one channel; and
      an outlet coolant port extending outside the housing, for transferring liquid coolant from the at least one channel;
   coupling an input conduit to the inlet cooling port of the cold plate;
   coupling an output conduit to the outlet cooling port of the cold plate; and
   connecting the input and the output conduits within a liquid coolant fluid loop, such that liquid coolant circulated around the liquid coolant fluid loop is passed through at least the input conduit, through the cold plate, and through the output conduit.

17. The method of clause 16, further comprising:
   arranging the input and output conduits to pass through an opening in a wall of the module housing.

18. The method of clause 16 or clause 17, wherein connecting the input and the output conduits within a liquid coolant fluid loop comprises:
   coupling the input conduit to a first exit port of a manifold;
   coupling the output conduit to a first entrance port of the manifold;
   coupling a supply conduit to a second entrance port of the manifold, for transferring liquid coolant to the manifold from a heat exchanger; and
   coupling a receiving conduit to a second exit port of the manifold, for transferring liquid coolant from the manifold to the heat exchanger.

19. The method of clause 18, further comprising securing the manifold to the rack.

20. The method of clause 19, wherein securing the manifold to the rack comprises securing the manifold within a duct defined in the rack for passage of cables connected to the electronic module.

21. The method of any one of clauses 18 to 20, further comprising:
connecting the heat exchanger between the supply conduit and the receiving conduit, the heat exchanger configured to transfer heat out of the liquid coolant.

22. The method of any one of clauses 18 to 21, further comprising:
connecting a pump between the supply conduit and the receiving conduit, the pump configured to circulate the liquid coolant around the liquid coolant fluid loop.

23. The method of clause 16 or 17, further comprising:
connecting the heat exchanger between the input conduit and the output conduit, the heat exchanger configured to transfer heat out of the liquid coolant.

24. The method of clause 16, clause 17 or clause 23, further comprising:
connecting a pump between the input conduit and the output conduit, the pump configured to circulate the liquid coolant around the liquid coolant fluid loop.

25. A kit for use in the method of installation of clauses 16 to 24, comprising:
the cold plate;
a first pipe, for use as the input conduit; and
a second pipe, for use as the second conduit.

26. The kit of clause 25, wherein the inlet and the outlet coolant ports of the cold plate each comprise an independently rotating fluid connector, thereby allowing adjustment in the direction of the first or the second pipe coupled to the respective coolant port.

27. The kit of clause 25 or clause 26, wherein the cold plate further comprises pins and/or fins arranged within the at least one channel.

28. The kit of clause 27, wherein the pins and/or fins are arranged to extend from a bottom surface of the at least one channel that is proximate the surface of the housing arranged to provide the thermal interface to a top surface of the at least one channel that is distal the surface of the housing arranged to provide the thermal interface.

29. The kit of any one of clauses 25 to 28, further comprising a manifold for connection of the input and the output conduits within the liquid coolant fluid loop, the manifold comprising:
a first entrance port, for coupling to the output conduit;
a first exit port, for coupling to the input conduit;
a second entrance port, for receiving liquid coolant at the manifold through a supply conduit; and
a second exit port, for transferring liquid coolant from the manifold though a receiving conduit.

30. The kit of clause 29, wherein the manifold is configured to be secured to the rack within a duct defined in the rack for passage of cables for connection to the electronic module.

31. The kit of clause 29 or clause 30, further comprising a heat exchanger, for connection between the supply conduit and the receiving conduit.

32. The kit of any one of clauses 29 to 31, further comprising a pump, for connection between the supply conduit and the receiving conduit, the pump configured for circulating the liquid coolant around the liquid coolant fluid loop.

33. The kit of any one of clause 25 to 29, further comprising a heat exchanger, for connection between the input conduit and the output conduit.

34. The kit of any one of clauses 25 to 29 or clause 33, further comprising a pump, for connection between the supply conduit and the receiving conduit, the pump configured for circulating the liquid coolant around the liquid coolant fluid loop.

BRIEF DESCRIPTION OF THE DRAWINGS

The disclosure may be put into practice in a number of ways and preferred embodiments will now be described by way of example only and with reference to the accompanying drawings, in which.

In the drawings, like parts are denoted by like reference numerals. The drawings are not drawn to scale.

DETAILED DESCRIPTION OF PREFERRED EMBODIMENTS

Figure 1:
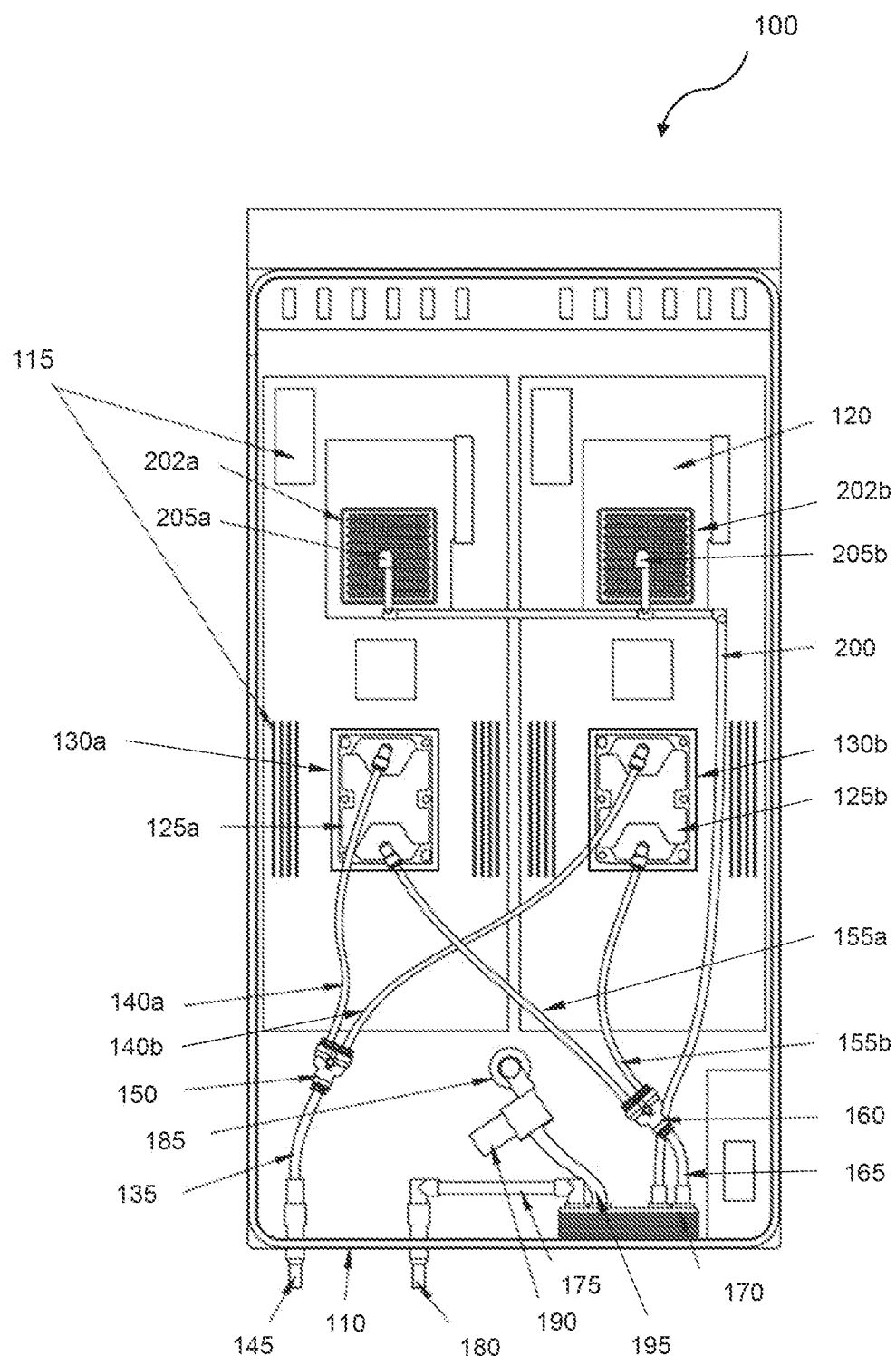
FIG. 1 shows a plan view of an electronic module housing a plurality of electronic devices cooled by the described system.

There is described an electronic module 100 having a hybrid cooling system, including two cooperating circulatory loops of liquid coolant. Referring first to FIG. 1, there is depicted a preferred embodiment of an electronic module 100, which may be a module or server blade, having appropriate dimensions and outer connectors to fit within a commonplace server rack (not shown). The same electronic module 100 is shown in FIG. 2 and FIG. 3, which each depict different perspective views of the module.

The electronic module has an outer housing or enclosure 110, has a base, walls and lid, and may be sealable. A plurality of electronic devices (or heat generating components) are mounted within the housing. In some cases, the components may be mounted on printed circuit boards (PCB) 120 which may be connected to the base, lid or a wall of the housing. The described system looks to remove heat generated by the electronic devices from within the electronic module.

A first cooling circulatory arrangement (or first cooling loop) is used to cool certain electronic devices of the plurality of electronic devices mounted within the electronic module. A second cooling circulatory arrangement (or second cooling loop) is used to cool others of the heat generating components. For instance, the second cooling circulatory arrangement can be provided with a greater cooling power, and so be used to cool specific components which generate greater amounts of heat than those components cooled by the first cooling circulatory arrangement.

Figure 2:
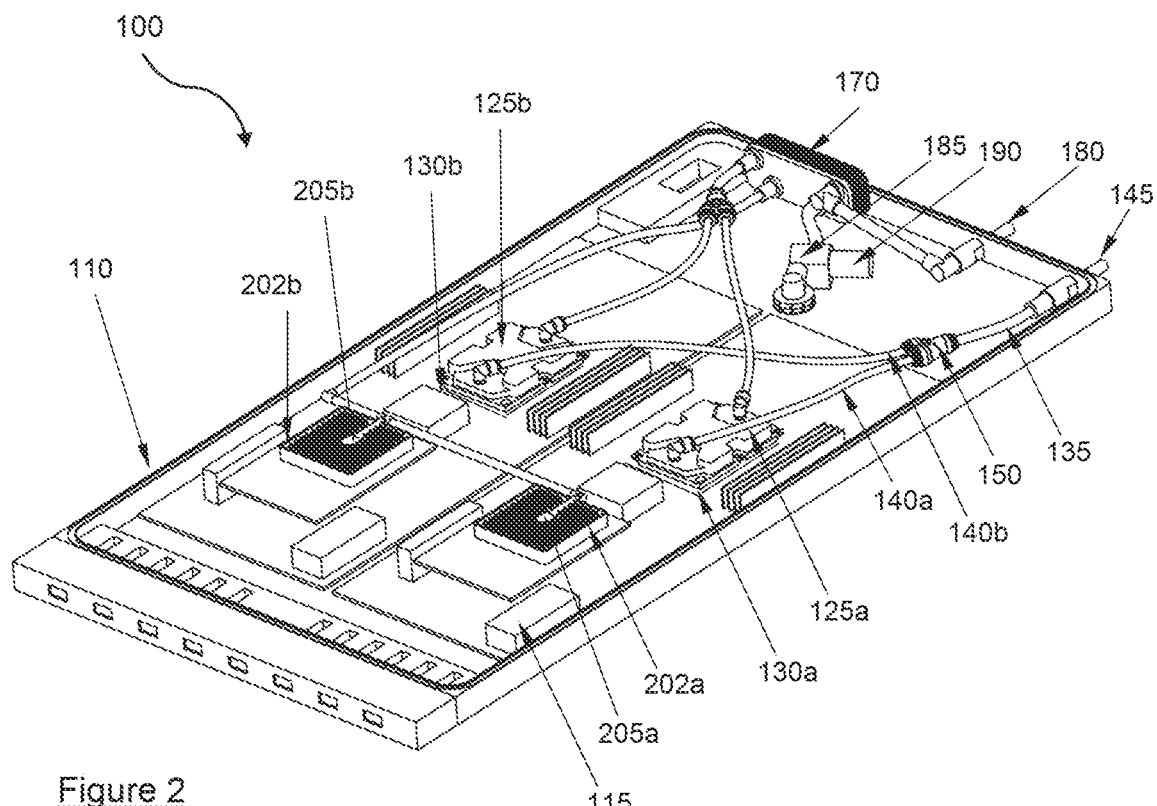
FIG. 2 depicts a perspective view of the electronic module of FIG. 1.
Figure 3:
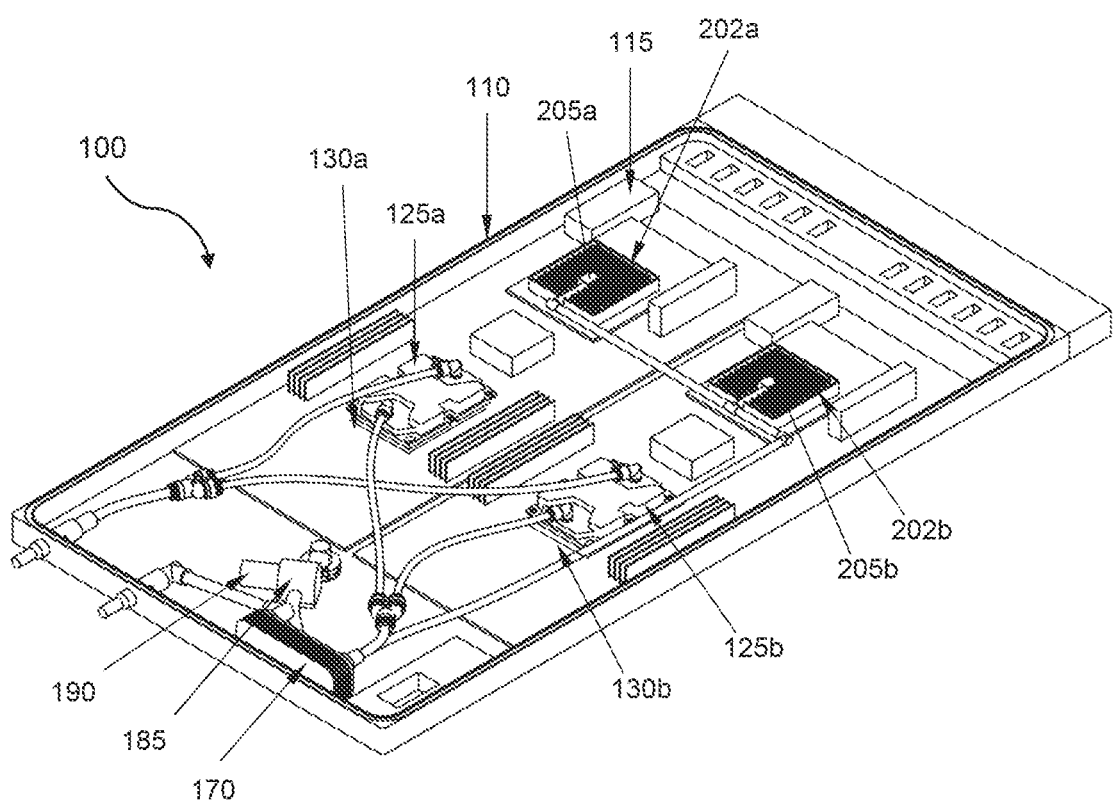
FIG. 3 depicts a second, different perspective view of the electronic module of FIGS. 1 and 2.

In the example depicted in FIGS. 1, 2 and 3, an electronic module has a first cooling circulatory arrangement (or first cooling loop) that provides immersive cooling. The first cooling circulatory arrangement is contained entirely within the housing 110 of the electronic module. In particular, a first liquid coolant is contained within the sealable housing of the electronic module, so that a number of components to be cooled 115 are at least partially immersed in the first liquid coolant. The first liquid coolant contained in the volume of the housing of the electronic module may be considered as a reservoir of first liquid coolant.

First liquid coolant from the reservoir of first liquid coolant is collected or received at a pump input 190. The pump input 190 may be shaped in order to improve flow of the liquid coolant towards a pump 185. The pump 185 moves the first liquid coolant through the first cooling circulatory arrangement (or first cooling loop). First liquid coolant passed through the pump 185 is moved through a pipe 195 and into a heat exchanger 170, where it will be cooled. In particular, heat retained in the first coolant fluid maybe transferred to the second coolant fluid, which is also passed through the heat exchanger, as described below. As will be understood, first liquid coolant entering the heat exchanger is at a higher temperature to the first liquid coolant passing out of the heat exchanger.

In the example of FIGS. 1, 2 and 3, a pipe 200 is connected to the heat exchanger to carry first cooling fluid that is output from the heat exchanger 170. At the distal end of the pipe 200 are one or more outlets or nozzles 205a, 205b. In the specific example of FIGS. 1, 2 and 3, the outlets or nozzles 205a each form the inlet to a weir 202a, 202b. The weirs acts as heat sinks, and are part of the first cooling circulatory arrangement. The weir is described below in further detail with respect to FIGS. 6 to 11.

First cooling fluid passes out of outlets or nozzles 205a, 205b and through the weir 202a, 202b, until being collected within the reservoir of first liquid coolant contained within the volume of the housing 110 of the electronic module 100. In this way, the cooler first cooling fluid which has passed through the heat exchanger can be reintroduced to the bath or reservoir of the first cooling fluid within the housing 110, and cool any electronic components partially immersed in the reservoir. Specifically, the cooled first liquid coolant will absorb heat from the surfaces of the electronic devices (including the first electronic device with which it is in contact). Eventually, the first liquid coolant will once again be collected at the pump input, thereby completing the first cooling circulatory arrangement (or first cooling loop).

FIGS. 1, 2 and 3 also depict a second cooling circulatory arrangement. The second cooling circulatory arrangement incorporates one or more cold plates 125a, 125b, which are each mounted to one or more electronic devices 130a, 130b. Ideally, the electronic devices 130a, 130b require higher performance cooling. The cold plates 125a, 125b are a module or chamber, through which a second coolant fluid (such as water) can be passed. Heat can be transferred to the second coolant fluid within the cold plate from the electronic devices 130a, 130b, by conduction of the heat through the mounting surface of the cold plate, coupled to the given electronic device. The cold plates 125a, 125b of the second cooling circulatory arrangement are discussed in more detail below, with respect to FIGS. 12A, 12B and 12C.

The second cooling circulatory arrangement of FIGS. 1, 2 and 3 has two cold plates, connected in parallel. In particular, a single input conduit 135 is connected to an inlet 145 at the wall of the housing, in order to receive a second coolant fluid input to the electronic module. The inlet 145 comprises a connector, which may be any suitable type of connector, including a quick disconnect connector. At a distal end, the single input conduit 135 is connected to an input manifold 150, to which two further input conduits 140a, 140b are connected. The further input conduits 140a, 140b are each connected to a respective cold plate 125a, 125b. In this way, the second coolant fluid can be transported, in parallel, to each of the cold plates 125a, 125b within the electronic module. The second liquid coolant is then passed through the cold plate, as discussed below in relation to FIGS. 12A, 12B and 12C.

An output conduit 155a, 155b is connected to each of the respective cold plates 125a, 125b. The output conduits 155a, 155b receive the second liquid coolant output from each of the cold plates 125a, 125b, in parallel. The output conduits 155a, 155b are connected to an output manifold 160, to which is also connected a single output conduit 165, for transporting the second liquid coolant out of the output manifold 160.

The single output conduit 165 is connected to the heat exchanger 170 discussed above with respect to the first cooling circulatory arrangement. The heat exchanger 170 is arranged entirely within the housing 110 of the electronic module. In the particular example of FIGS. 1, 2 and 3, the heat exchanger 170 is a plate heat exchanger and connected to the wall of the housing 110. However, other suitable types of heat exchanger (as discussed further below) could be used, and could be arranged anywhere within the electronic module (and, less preferably, outside the electronic module).

The heat exchanger 170 may be of any suitable type that allows exchange of heat between the first and second coolant fluid whilst maintaining separation (not intermingling) of the two liquid coolants. For instance, the heat exchanger may have a first chamber, through which the first liquid coolant flows, which is separated from a second chamber, through which the second coolant fluid flows. The wall or walls separating the first and second chamber acts as a thermal interface, through which heat can be transferred. In particular, heat can be transferred from the hotter liquid coolant (which in the present example, will be the second liquid coolant under normal operation) to the cooler liquid coolant (which in the present example, will be the first liquid coolant under normal operation), as a result of the temperature gradient across the thermal interface. As can be envisaged by a person skilled in the art, more than two chambers could be included within the heat exchanger, and more than one thermal interface could be provided to separate the chambers through which the different liquid coolants flow. The heat exchanger may comprise fins or other features at the thermal interface to promote heat exchange.

Turning back to FIGS. 1, 2 and 3, an output pipe 175, connected to the heat exchanger 170 is arranged to receive the second liquid coolant passed through the heat exchanger. As will be understood, the second liquid coolant passing out of the heat exchanger 170 will be at a higher temperature than the second liquid coolant entering the heat exchanger 170, as a result of the heat absorbed from the first liquid coolant within the heat exchanger 170. The output pipe 175 is connected to an outlet 180 at the wall of the housing 110 of the electronic module. The outlet 180 comprises a connector, which may be any suitable type of connector, including a quick disconnect connector.

Although not shown in FIGS. 1, 2 and 3, the inlet 145 and the outlet 180 may each be connected to a cooling system or second liquid coolant supply (for instance by further pipes, connected to the inlet 145 and outlet 180, as necessary). This is discussed in further detail below, in relation to FIGS. 4A and 4B.

As will be understood, different devices within an electronic module may produce different amounts of heat than other components, and so require a different rate of cooling. Therefore, the present invention provides a cooling system which delivers effective and efficient cooling for all electronic devices within an electronic module. In particular, the second cooling circulatory arrangement may provide high performance cooling of the hottest components, whilst the first cooling circulatory arrangement may provide cooling for other components within the electronic module. Although certain previous systems have described use of a first and second cooling loop within an electronic module (for instance, as described in U.S. Pat. No. 7,724,524), the use of a heat exchanger to exchange heat between the first and second cooling circulatory arrangement in the present application improves the overall efficiency of cooling. In contrast, in prior art systems, cooling may be limited by the exposure of the reservoir of a first coolant to the cold plate cooled by the second coolant.

Figure 4A:
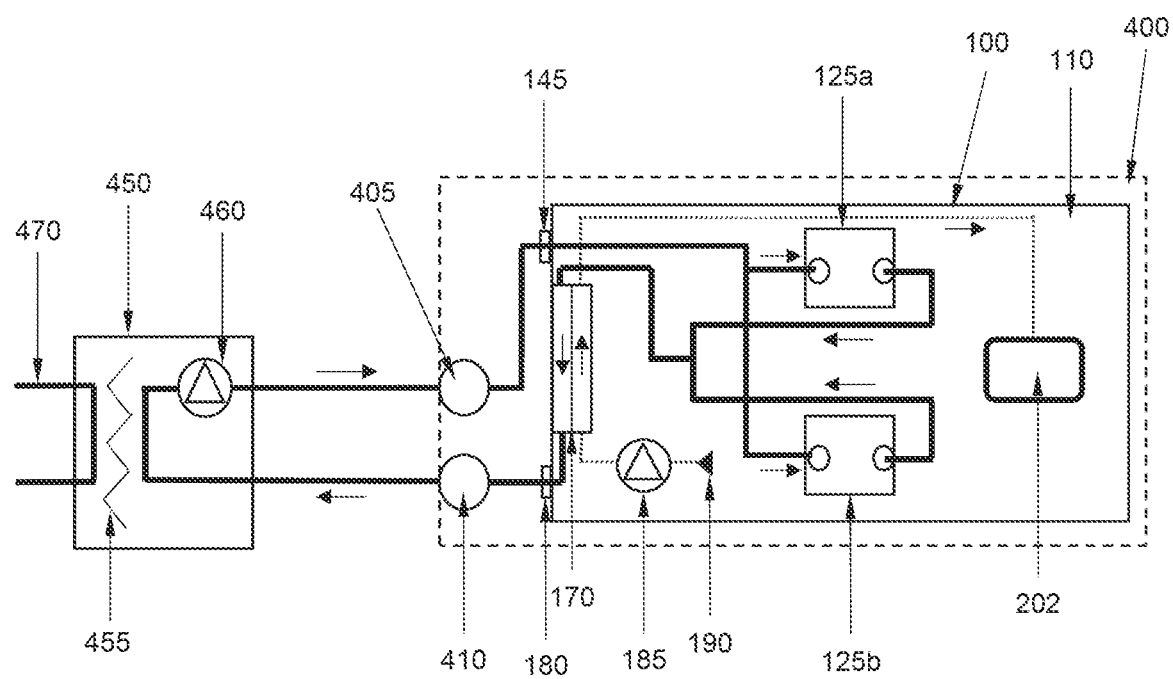
FIG. 4A depicts a schematic view of a first example of the second cooling circulatory arrangement.
Figure 4B:
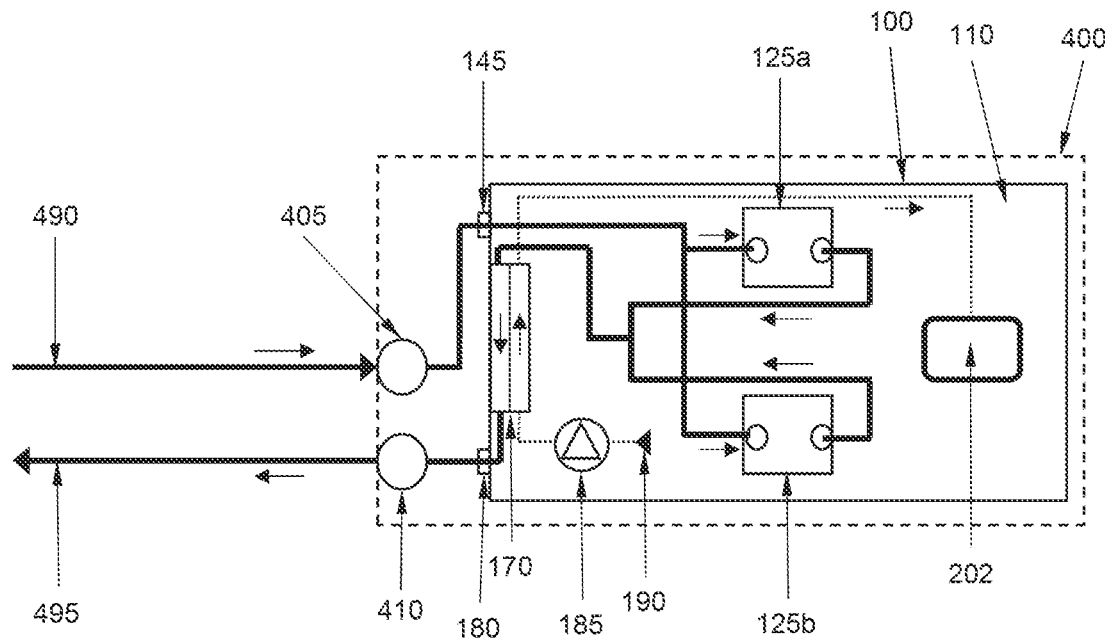
FIG. 4B depicts a schematic view of a second example of the second cooling circulatory arrangement.

FIGS. 4A and 4B show a schematic view of the first and second cooling circulatory arrangement, when the electronic module 100 is connected in a rack 400. The arrangement of the first and second cooling circulatory arrangements, within the electronic modules are the same for both the examples of FIGS. 4A and 4B and align with the first and second cooling circulatory arrangements of FIGS. 1, 2 and 3 (except for the provision of only a single weir 202 in the examples of the first cooling circulatory systems of FIGS. 4A and 4B). However, the apparatus for providing low temperature second liquid coolant to the electronic modules is different within the two examples of FIGS. 4A and 4B.

Considering the aspects in common first, FIGS. 4A and 4B shows the first cooling circulatory system as described above, having a pump inlet 190, pump 185, heat exchanger 170, and weir 202 for circulation of first liquid coolant 401 within the housing of the electronic module 100. FIGS. 4A and 4B further shows the second cooling circulatory arrangement as described above. In this arrangement, the second liquid coolant 402 is received into the electronic module 100 though an inlet 145, and through conduits to provide the coolant to two cold plates 125a, 125b, arranged in parallel. After passing through the cold plates 125a, 125b, the second liquid coolant is transported through various conduits to the heat exchanger 170, where heat is transferred from the first liquid coolant to the second liquid coolant. From the heat exchanger 170, the second liquid coolant is passed out of the electronic module via an outlet 180. The inlet 145 and outlet 180 may each be connected to an inlet 405 or outlet 410 manifold, respectively, at the server rack 400 in which the electronic module 100 is mounted.

In the example of FIG. 4A, a cooling system 450 is connected as part of the second cooling circulatory arrangement. In particular, second liquid coolant exiting from the outlet 180 of the electronic module and passed to an outlet manifold 410 is input to a cooling system 450. The cooling system 450 comprises a heat exchanger 455 and a pump 460. Heat is transferred out of the second liquid coolant to a further cooling medium 470 at the heat exchanger 455, wherein the cooled second liquid coolant is pumped back to the inlet manifold 405 and the inlet 145 of the electronic module 100. The further cooling medium 470 may be air, or further liquid coolant, for instance.

In the example of FIG. 4B, the second cooling circulatory arrangement can be provided with lower temperature second liquid coolant by a facility level provision. In particular, the second liquid coolant is water, and fed from the mains water supply 490 at a facility level. The higher temperature second liquid coolant received from the electronic module can be passed to the mains drainage 495 at the facility level.

Figure 5:
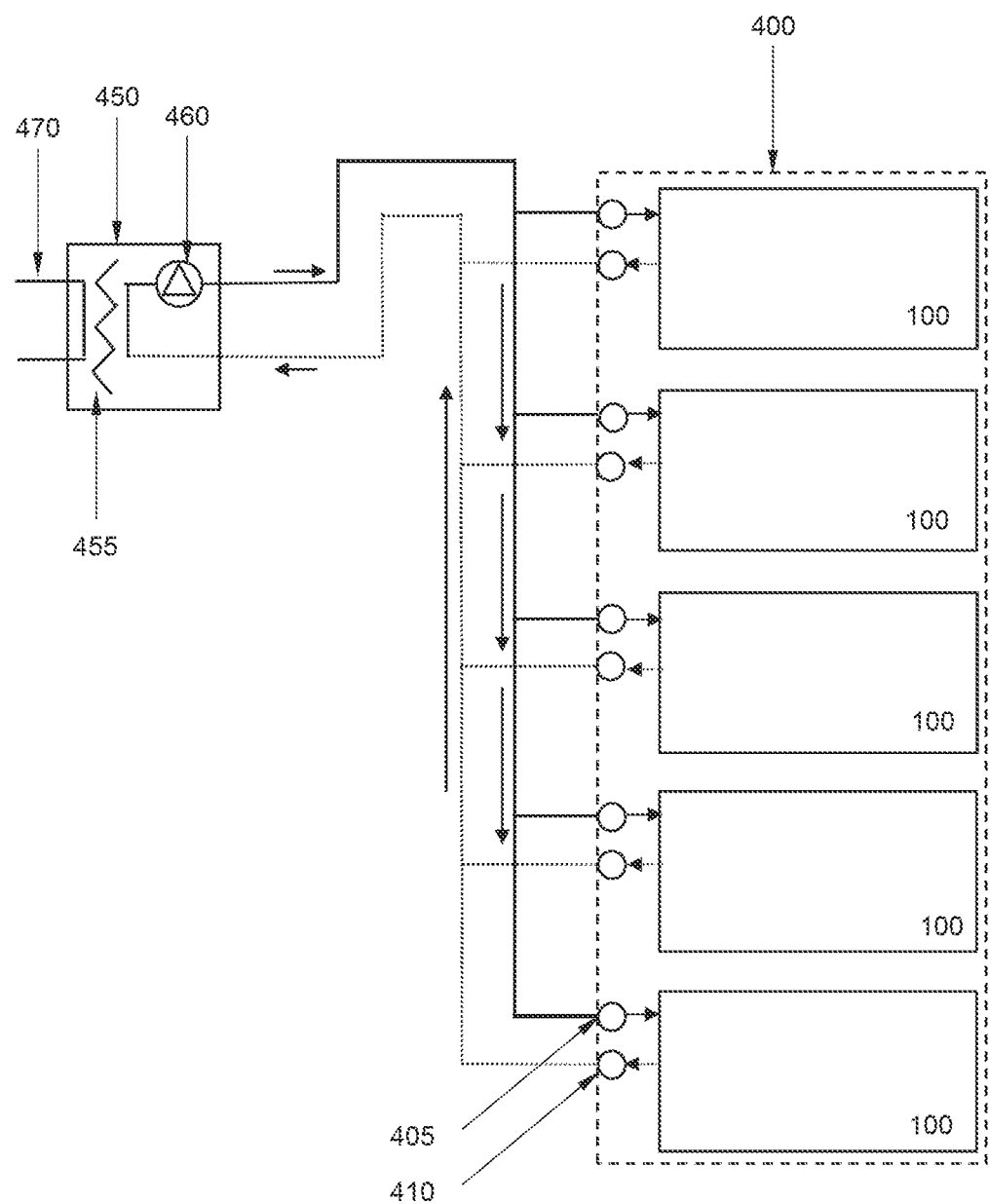
FIG. 5 depicts a schematic view of a plurality of electronic modules mounted in a rack.

FIG. 5 shows an example of a number of electronic modules 100 according to the examples FIGS. 1, 2 and 3 mounted in a rack 400 of FIG. 4A. Here, the second cooling circulatory arrangement is connected to a rack level cooling system 450. In particular, a number of electronic modules are connected in parallel, with a single cooling system 450 (as described above in relation to FIG. 4A) used to cool the secondary liquid coolant supplied to each of the electronic modules 100 within the rack 400.

It will be understood that the second cooling circulatory arrangement of a plurality of electronic modules mounted in a rack 400 in the manner shown in FIG. 5, could also be supplied with lower temperature second liquid coolant by connection to a facility level cooling system, such as a facility level cooling water system fed by mains water shown in FIG. 4B.

The weir of the first cooling circulatory system will now be described in more detail with reference to FIGS. 6 to 11. The weir provides particular advantages for directing and increasing the flow of the first liquid coolant in the first cooling circulatory arrangement. By use of the weir, the first liquid coolant can be directed to flow over or through specific regions of the electronic module, and any electronic devices mounted therein. In some examples, the base of the weir may be coupled to the first electronic device (or another electronic device), and therefore act as a heat sink for the coupled device. In addition, use of the weir allows the level of first liquid coolant required in the electronic module to be reduced, as discussed further below.

Figure 6:
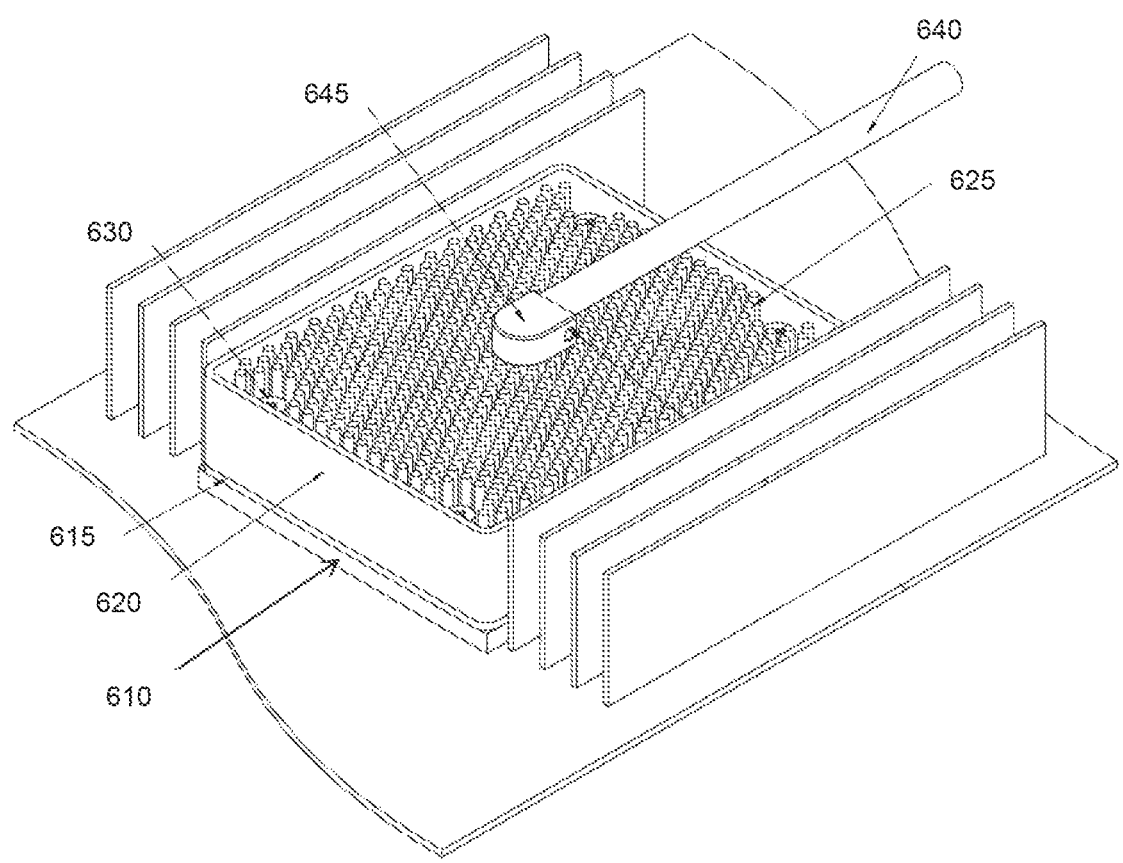
FIG. 6 illustrates a perspective view of a weir within the first cooling circulatory arrangement.
Figure 7:
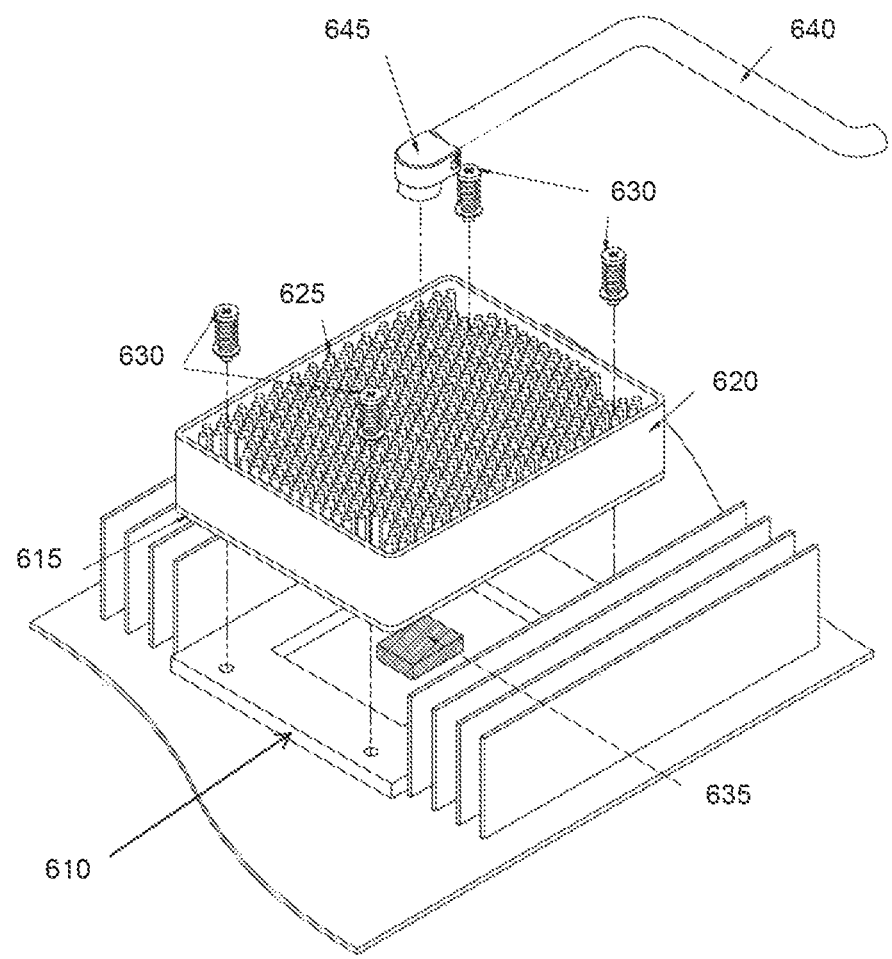
FIG. 7 illustrates an exploded view of the weir within the first cooling circulatory arrangement.

Referring first to FIG. 6, there is illustrated a first embodiment of a weir or weir heat sink for use in the first cooling circulatory system. With reference to FIG. 7, there is shown an exploded view of the embodiment of FIG. 6. The weir 600 comprises: a base made up of a mount 610 and a planar substrate 615 fixed to the mount 610; a retaining wall 620 attached to the planar substrate 615; projections (shown in the form of pins) 625; and fixing screws 630, which attach the substrate 615 to the mount 610. In this way, the planar substrate 615 sits directly on a high temperature component, which may be the first electronic device 635. As such, heat is transferred from the first electronic device 635 to a volume defined by the planar substrate 615 and the retaining wall 620, in which projections 625 are provided.

The weir heat sink 600 can be made from a single component, for example by: die cast; lost wax casting; metal injection mould (MIM); additive manufacture; or forged. It could also be machined out of a block of material or skived. The weir heat sink 600 may be formed from any material that is thermally conductive, such a metal or other thermal conductor. Some examples may include aluminium, copper or carbon.

Also shown in FIGS. 6 and 7 are a pipe 640 and an inlet to the weir at a nozzle 645. The first liquid coolant is delivered to the weir heat sink 600 via the nozzle 645. The nozzle 645 is arranged to direct coolant perpendicular to the plane of the substrate 615. This forces the jet or flow of the liquid coolant directly into the volume defined by the substrate 615 and retaining wall 620 of the heat sink 600. As a consequence, the heat dissipation is improved. This is especially the case in comparison with a system where coolant is directed to flow over a heat sink, in a direction parallel to the plane of the heat sink substrate, such as in an air cooled system.

In the examples shown in FIGS. 6 and 7, the nozzle 645 delivers the coolant directly in the centre of the volume defined by substrate 615 and retaining wall 620. In this example, the centre of that volume corresponds with the hottest part of the area of the substrate 615, which is adjacent to (and directly on) the high temperature component 635. This provides a contraflow, such that the coldest coolant is directed to contact the hottest area of the weir heat sink. The coolant moves out radially from the hottest part.

Figure 8:
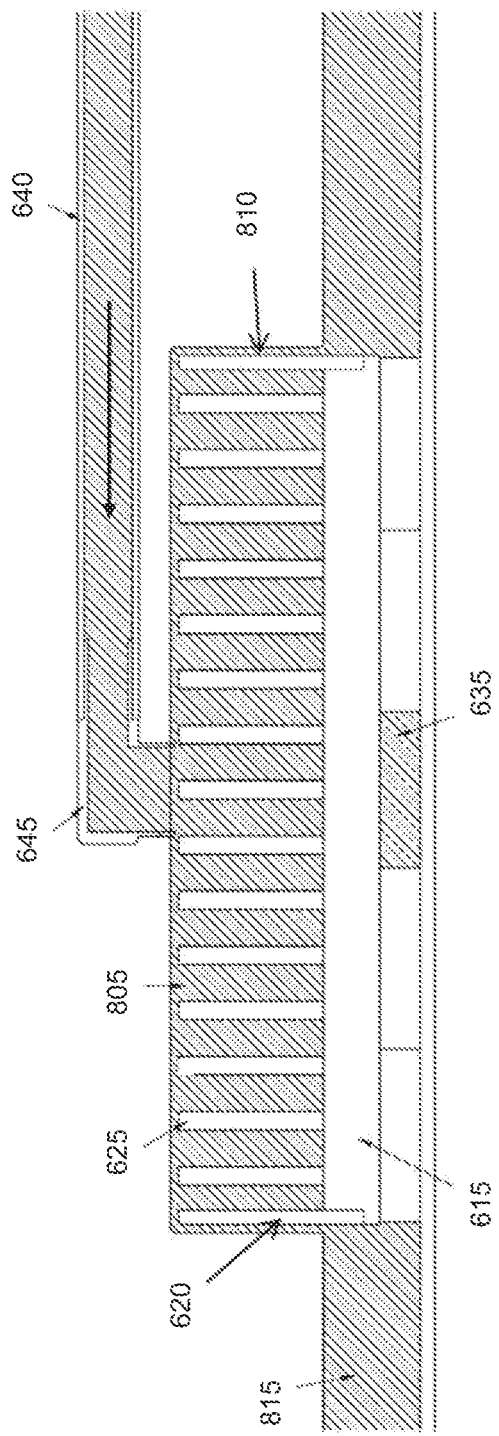
FIG. 8 illustrates a cross-sectional view of the weir within the first cooling circulatory arrangement.

With reference to FIG. 8, there is shown a cross-sectional view of the weir heat sink in FIG. 6 in operation. The same features as shown in previous drawings are identified by identical reference numerals. An arrow indicates the flow of coolant within the pipe 640, to provide first liquid coolant 805 within the volume defined by the substrate 615 and retaining wall 620 of heat sink 600 and first liquid coolant 810 outside the heat sink 1. As indicated previously, first liquid coolant emerging from nozzle 645 is directed towards the centre of the volume (corresponding with the centre of the surface area of substrate 615) and from there moves out radially towards the retaining wall 620. Sufficient first liquid coolant is pumped via nozzle 645 into the volume, such that it overflows 810 the retaining wall 620 and collects with remaining first liquid coolant 815 exterior to weir heat sink 600.

The retaining wall 620 acting as a side wall enables different levels of coolant. The first liquid coolant 805 within the volume of the weir heat sink 600 is at a relatively high level and the coolant 815, which at least partially immerses a plurality of other electronic devices in the electronic module (not shown in this drawing), is at a lower level. This allows significantly less liquid coolant to be used than in other similar systems that cover all components at the same height.

A number of benefits are thereby realised. Firstly, if a dielectric coolant is used as the first liquid coolant, less first liquid coolant is used. This has two main benefits: dielectric coolant can be expensive and so costs can be significantly reduced, and dielectric liquid coolants are typically very heavy, and so weight of the electronic module can be reduced. Moreover, by using less liquid coolant, the electronic module 100 can be more straightforward to install and/or lift. Also, installing the electronic module 100 can require less infrastructure. In addition, the electronic module 100 is easier to handle than similar devices are systems using significantly more primary liquid coolant. The level of the first liquid coolant 815 within the majority of the container 110 is not close to the top of the container. As a result, spillages during maintenance or exchange of components are less likely. The risk of leakage is also reduced.

The retaining wall 630 creates a weir effect, and promotes flow of the first liquid coolant. The coolant 815 at a relatively low level cools the electronic devices in the electronic module 100 (the first electronic device, and any other electronic device). It is not necessary for the first electronic device, and any other electronic devices, to be fully immersed in first liquid coolant. The first liquid coolant retained in the weir heat sink 600 may also provide some redundancy to the cooling of the first cooling circulatory arrangement, in the event of a failure of the pump 185 or other component.

Figure 9:
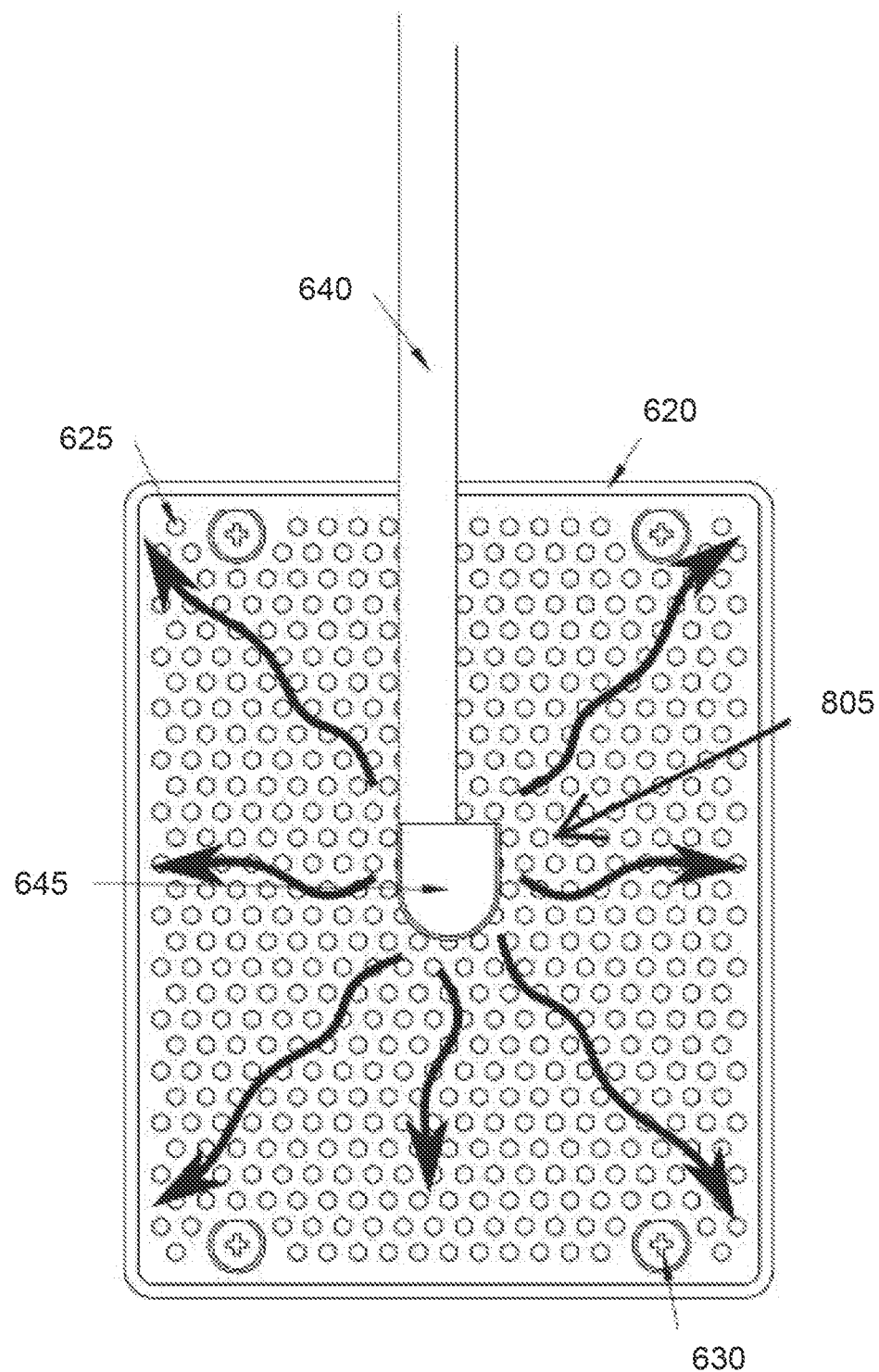
FIG. 9 illustrates a further view of the weir within the first cooling circulatory arrangement.

Referring next to FIG. 9, there is shown a top view of the embodiment of FIG. 7, showing a nozzle arrangement. As previously discussed, the nozzle 645 is coupled to pipe 640. The nozzle 645 is positioned to face the centre of the surface area of the substrate 615 (not shown in this figure). The radial flow of coolant is shown by arrows in this drawing.

Figure 10:
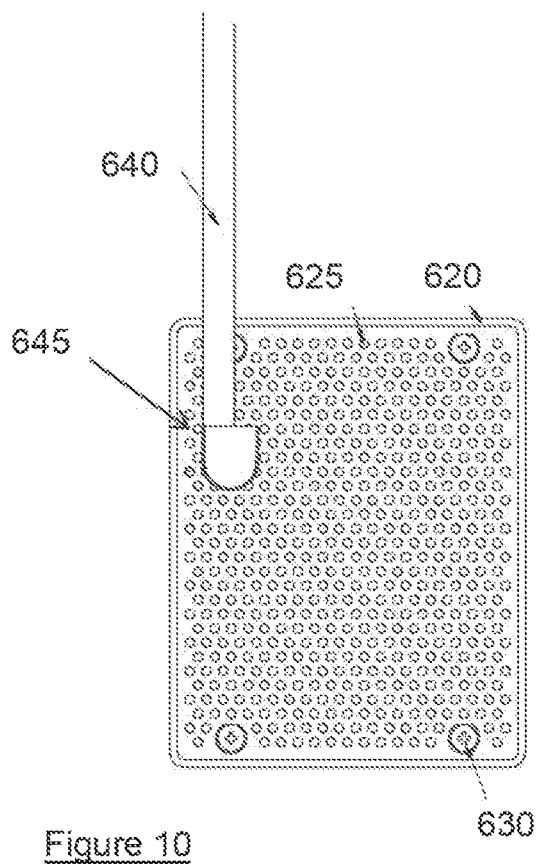
FIG. 10 illustrates a further example of a weir within the first cooling circulatory arrangement.
Figure 11:
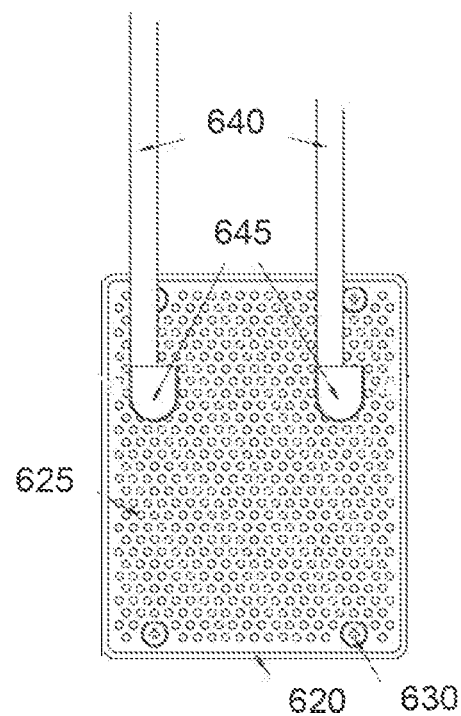
FIG. 11 illustrates a still further example of a weir within the first cooling circulatory arrangement.

Alternative positions for the nozzle 640 are possible. Some such positions will now be described with reference to FIG. 10, in which there is shown a top view of the first variant of the nozzle arrangement of the embodiment of FIG. 6 and with reference to FIG. 11, in which there is shown a top view of a second variant of the nozzle arrangement of the embodiment of FIG. 6. Referring first to FIG. 10, the nozzle 645 is shown off-centre. Such an arrangement may be provided if the hottest part of the first electronic device (not shown, to which the weir heat sink 600 may be coupled) is not adjacent the centre of the substrate 615. Referring to FIG. 11, two nozzles are shown. The two nozzles 645 are positioned over the surface area of the substrate 615 (not shown) adjacent two of the hottest parts of the first electronic device (not shown, to which the weir heat sink 600 may be coupled).

The projections 625 (as pin and/or fins) could integrally be formed with the rest of weir heat sink 600 or be made from separate components. The projections 625 could be tolerance fit, glued or brazed in place. Additionally or alternatively, the retaining wall 620 could be integrally formed or made separately from the rest of the heat sink 600, for example by an extrusion or fabricated sheet metal part. Then, the retaining wall 620 could be tolerance fit, glued in place, brazed or welded.

The cold plate of the second cooling circulatory arrangement will now be described in more detail with reference to FIGS. 12A to 12C. The cold plate has particular advantages to provide high performance, efficient cooling of specific electronic devices to which the cold plate is coupled. As such, the second cooling circulatory arrangement, and more specifically the cold plates, can be coupled to the electronic devices in the electronic module which produce the greatest amount of heat. Although it would not be practical to cool every electronic device within the electronic module in this way, the use of cold plates as part of the second cooling circulatory arrangement allows focussed cooling which can reduce the burden of cooling the whole volume of the electronic module by the first cooling circulatory system. As such, the first and the second cooling circulatory arrangement act in cooperation to provide a particularly efficient and effective cooling system for the electronic module.

A further benefit of the cold plates within the second cooling circulatory arrangement is the provision of a closed, sealed system, wherein the second liquid coolant does not make direct contact with any electronic device. This allows use of water for the second liquid coolant (rather than dielectric liquid, for instance), which is readily available at a low cost. A large throughput of water through the second cooling circulatory arrangement is possible if the second cooling circulatory arrangement is connected to a facility water supply and drainage, or to a powerful pump system external to the electronic module, which further increases the potential cooling power of the second cooling circulatory arrangement.

In general terms, there is herein described a cold plate, comprising a housing (which may be integrally formed), a surface of the housing (typically planar) being arranged to provide a thermal interface (which may be termed a conduction surface) for cooling an electronic device thermally coupled thereto. The cold plate further comprises at least one channel within the housing and proximate to the surface. The channel or channels may be formed of an internal chamber (or chambers), volume or other space for containing liquid coolant (such as water, a water-based coolant, a coolant that essentially comprises water or a high specific-heat capacity liquid alternative such as a mineral oil or dielectric fluid). The channel or channels are arranged for the liquid coolant to flow therethough, such that heat received by the thermal interface is transferred to the liquid coolant. Optionally, a plurality of parallel channels may be provided, each extending from the coolant port. As will be discussed further below, pins and/or fins are preferably arranged within the at least one channel.

The cold plate also comprises a coolant port extending outside the housing, for transferring liquid coolant to and/or from the at least one channel. The coolant port may be a connector, coupling, joint or other similar structure. An inlet and an outlet coolant port may be provided. At least one conduit, such as a pipe, hose or tube (preferably flexible), may be coupled to the coolant port for transferring liquid coolant to and/or from the coolant port. Advantageously, the cold plate is configured such that the liquid coolant remains substantially in a liquid state (that is, single phase liquid cooling) throughout the cooling system.

Figure 12A:
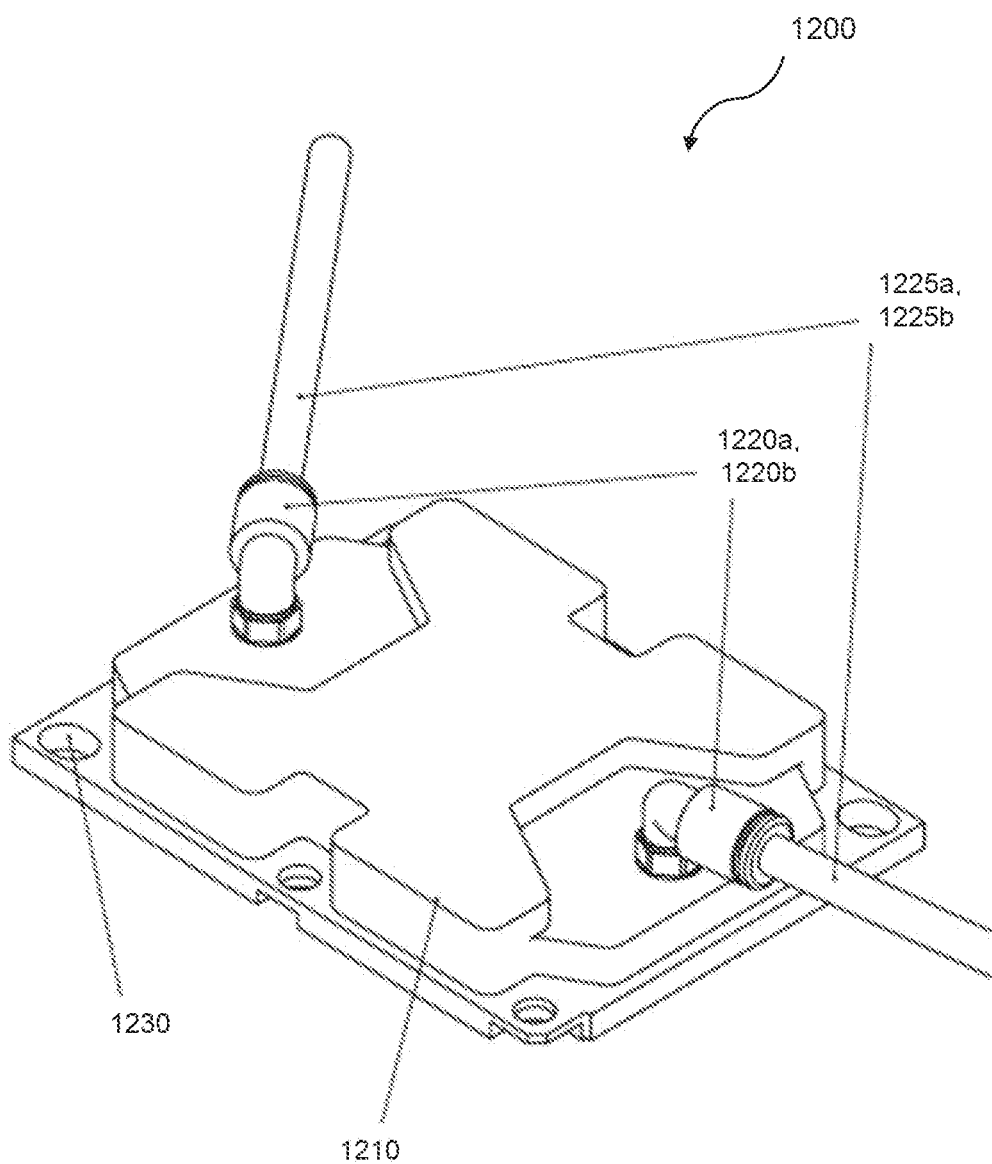
FIG. 12A shows a schematic, perspective view of an example cold plate.

Referring first to FIG. 12A, there is schematically shown an embodiment of a cold plate (or cold plate assembly) 1200 for use as the cooling module of the second cooling circulatory arrangement. In particular, the cold plate is advantageous for use in an electronic module or server blade (or similar module). The cold plate assembly comprises: a cold plate housing 1210 (preferably made integrally); connectors 1220a, 1220b forming an inlet/outlet port of the cold plate; and inlet/outlet conduits 1225 (which here are pipes or tubes). Also shown are fixture points 1230 for the cold plate 1200. These fixture points may beneficially replicate the ones found on air cooled heatsinks in a typical server chassis, allowing the cold plates to be retrofitted into a server blade.

In a preferred example, multiple coolant ports 1220a, 1220b are used, as shown in FIG. 12A. Then, a first coolant port 1220a is provided for transferring liquid coolant into the cold plate 1200, and a second coolant port 1220a is provided for transferring liquid coolant from the cold plate 1200. In the example of FIG. 12A, the coolant ports 1220a, 1220b are coupled to independently rotating fluid connectors (or swivel joints or swivel elbow connectors, the terms being used synonymously herein) thereby allowing adjustment in the direction of the inlet/outlet conduit 1225a, 1225b coupled to the coolant port 1220a, 1220b. As such, this type of connector are especially useful in configuring or installing the cold plate assembly for operation. The swivel joint may increase flexibility of placement of the cold plate. This may more readily allow retro-fitting of the cold plate to an existing electronic module, such as a server or other computer system, without the need to make any other changes to the unit or system. The cold plate may be configured to fit in place of an air-cooled heat sink, for example.

Preferably, the surface arranged to provide a thermal interface to an electronic device (such as the second electronic device) to which the cold plate is coupled is a bottom surface of the cold plate housing (for instance the underside, not shown, of the cold plate housing 1210 in FIG. 12A). Then, the coolant ports 1220a, 1220b are advantageously provided on a top surface of the housing 1210, opposite the bottom surface. In preferred embodiments, the coolant port extends in a direction perpendicular to the top surface of the housing. The swivel joint may then extend the coolant port in a different direction, typically more parallel to the top surface of the housing. Beneficially, the swivel joint allows the direction of the pipe to be adjusted around an axis perpendicular to the top surface of the housing. In particular, the swivel joint may allow the direction of the pipe to be adjusted through at least 90 degrees, 180 degrees, 270 degrees and preferably up to (and including) 360 degrees, especially around an axis perpendicular to the top surface of the housing. Thus, the swivel connector may allow full rotation freedom for the coolant port.

In principle, a single coolant port could provide both an inlet for liquid coolant to the channel and an outlet for liquid coolant from the channel. In the preferred embodiment, multiple coolant ports are used, as shown in FIG. 12A. Then, the coolant port is a first coolant port for transferring liquid coolant to the at least one channel. The cold plate may comprise a second coolant port for transferring liquid coolant from the at least one channel.

The housing of the cold plate, and the arrangement of the ports on the cold plate may take any shape beneficial to promote flow of coolant through the cold plate and to portions of a second electronic device to which the cold plate is coupled. In some examples, the housing is elongated and the first and second coolant ports are located at opposite ends of the housing along the direction of elongation, which may promote flow of liquid coolant across the thermal interface surface and/or aid flexible placement of the cold plate. Additionally or alternatively, the second coolant port may (like the first coolant port) comprise a swivel joint thereby allowing adjustment in the direction of a pipe coupled to the second coolant port. Providing two coolant ports, each with swivel joints, may allow improved ways of coupling the cold plate within a cooling system, including the potential to couple cold plates together.

Figures 12B, 12C:
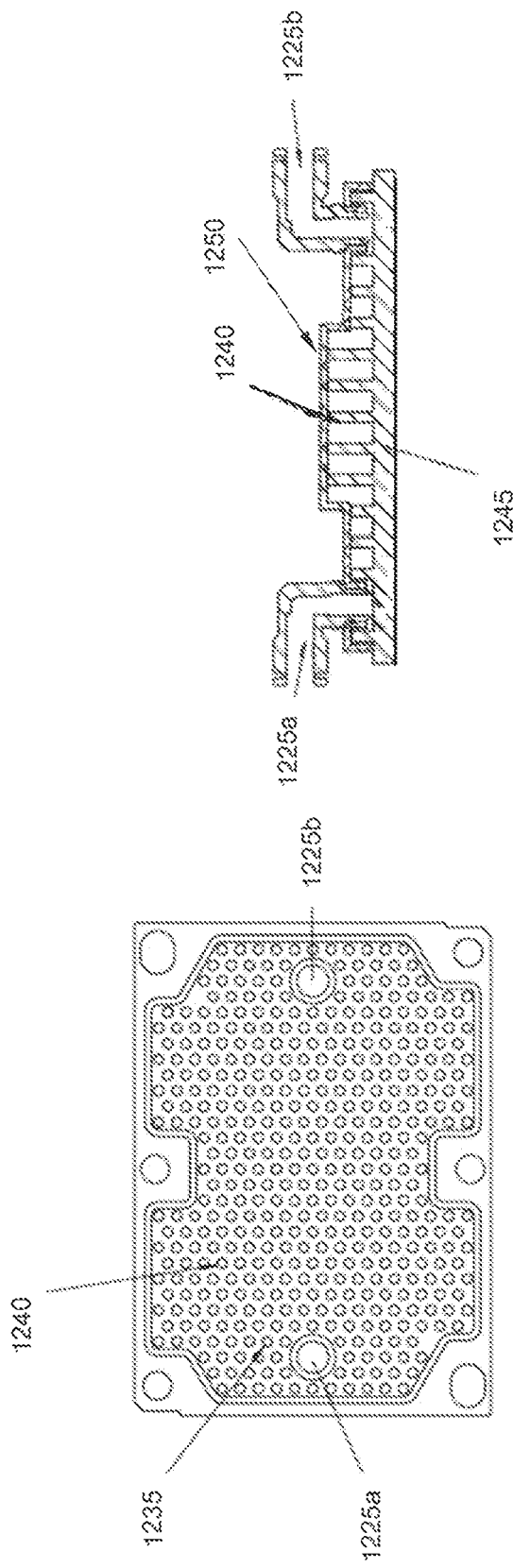
FIG. 12B shows a plan view of the internal structure of the example cold plate of FIG. 12A.
FIG. 12C shows a cross-sectional view of the example cold plate of FIG. 12A.

With reference to FIG. 12B, there is depicted a top internal (plan) view of an example cold plate in accordance with the example of FIG. 12A. In this drawing, the lid and nozzles are removed for clarity.

Shown in FIG. 12B are: coolant inlet port 1225a; coolant outlet or exhaust port 1225b; coolant flow channel 1235; and pins 1240. It can be seen that the flow channel is formed between a coolant inlet port 1225a and a coolant outlet or exhaust port 1225b, through which, when the cold plate is in use, the second liquid coolant can flow. This configuration, and especially the configuration of the pins 1240, distributes coolant flow in all directions within the cold plate, allowing coolant to spread evenly across the cold plate.

Referring to FIG. 12C, there is shown a side (cross-sectional) view of the embodiment of FIG. 12B, with connectors coupled to ports 1225a, 1225b, cold plate base 1245. Cold plate lid 1250 is also shown. The base plate 1245 and lid 1250 may together form the cold plate housing 1210 shown in FIG. 12A. As shown in FIG. 12C, the pins 1240 are connected to the base 1245 and lid 1250. This may ensure that no flow of liquid coolant passing through the channel 106 can short-cut or bypass the pins 109. In this way, the pins 109 can direct the coolant flow within the cold plate.

The base plate 1245 may provide the thermal interface, to which the second electronic device can be coupled. In particular, the cold plate 1200 can be mounted to an electronic device (for instance, a second or third electronic device 130a, 130b, as shown in FIGS. 1, 2 and 3), having the base plate 125 of the cold plate in direct contact with a surface of the second electronic device. In this way, heat may transfer from the surface of the electronic device, through the thermal interface provided by the base plate 1245, to the liquid coolant flowing within the cold plate.

All of the features disclosed herein may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

In particular, although FIGS. 1 to 4B above discuss a particular preferred embodiment of the invention in which one or more weir is incorporated within the first cooling circulatory system, and one or more cold plate is incorporated within the second cooling circulatory arrangement, these components are not necessarily required. In particular, in its most general form the concept described herein is the use of a first and second cooperating cooling circulatory system (or cooling loop), whereby both the first and second cooling circulatory arrangement each cool different electronic devices within an electronic module, and further wherein the second cooling circulatory arrangement is used to cool the first cooling circulatory system.

Figure 13A:
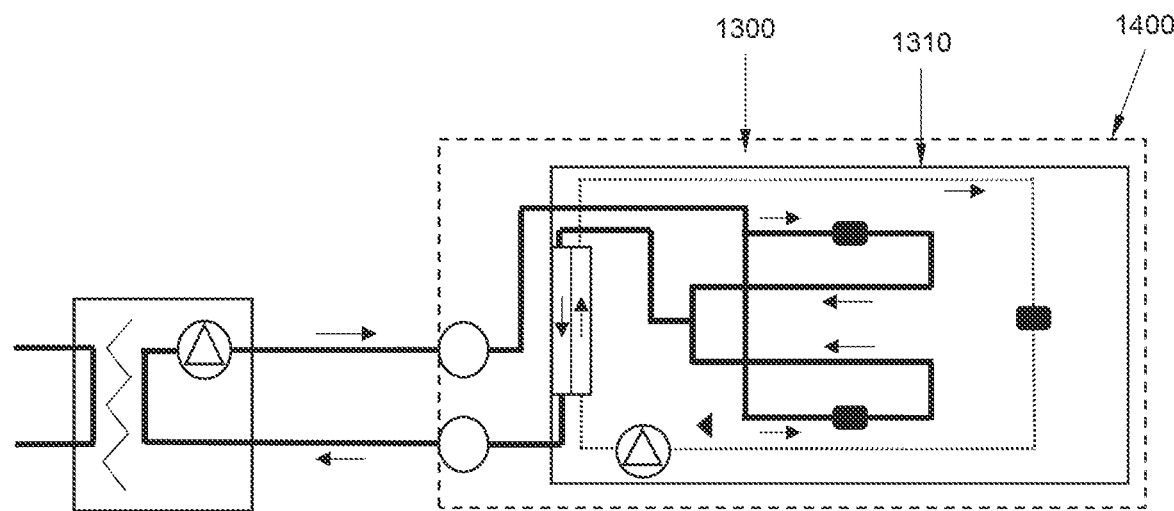
FIG. 13A depicts a schematic view of a further example of the system.
Figure 13B:
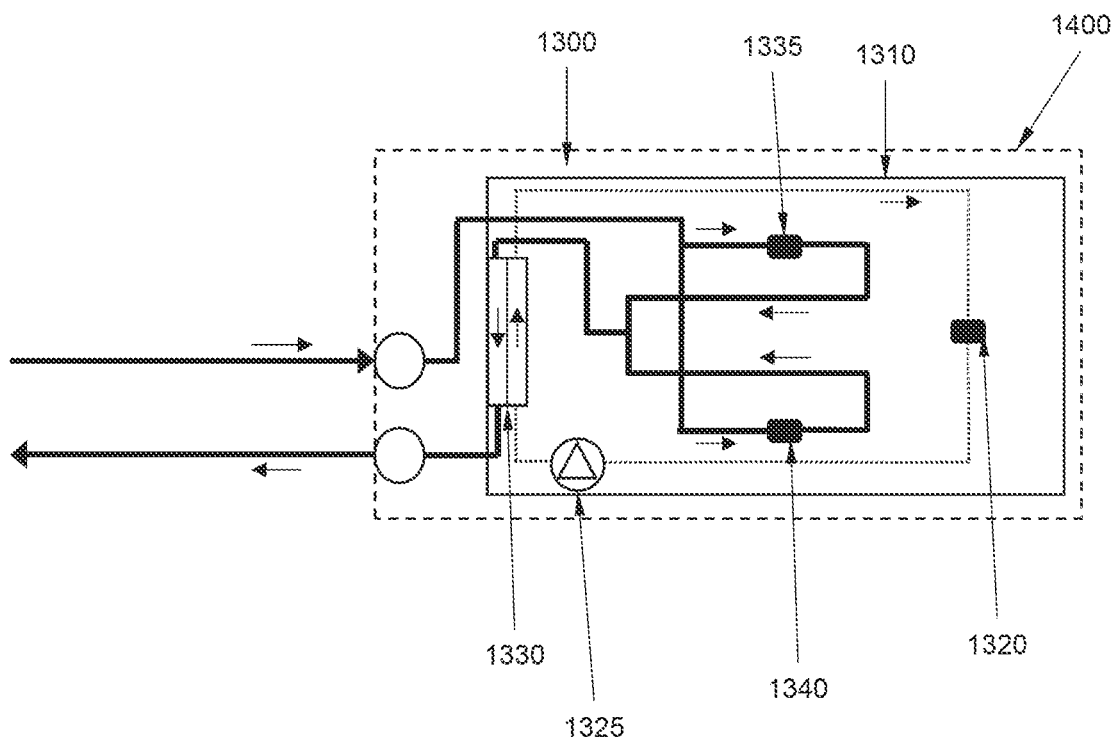
FIG. 13B depicts a schematic view of a still further example of the system.

This most general concept is depicted in FIGS. 13A and 13B. The examples of FIG. 13A and FIG. 13B illustrate the following first common feature: a first cooling circulatory system (dotted line) arranged to circulate a first liquid coolant between a first electronic device 1320 of a plurality of electronic devices and a heat exchanger 1330. In the specific example of FIGS. 13A and 13B, a pump 1325 is shown as forming part of the first cooling circulatory system, although this is not essential, and circulation could take place by other mechanisms (such as convection). In the first cooling circulatory system of FIGS. 13A and 13B, the first electronic device 1320 is thermally coupled to the circulating first liquid coolant (when the system is in use), such that heat is transferred from the first electronic device 1320 to the first liquid coolant.

The examples of FIG. 13A and FIG. 13B illustrate the following second common feature: a second cooling circulatory arrangement (bold line) is arranged to circulate a second liquid coolant between a second 1335 (and third 1340, in parallel) electronic device of the plurality of electronic devices and the heat exchanger 1330. The second and third electronic devices 1335, 1340 are thermally coupled to the second liquid coolant circulating in the second cooling circulatory arrangement (when the system is in use), such that heat is transferred from the second and third electronic devices 1335, 1340 to the second liquid coolant.

The examples of FIG. 13A and FIG. 13B illustrate the following third common feature: the first cooling circulatory arrangement and the second cooling circulatory arrangement are thermally coupled via the heat exchanger 1330. In other words, as the first liquid coolant and the second liquid coolant each pass through the heat exchanger 1330, heat is transferred from the first liquid coolant to the second liquid coolant via a thermal interface within the heat exchanger 1330.

In addition, FIG. 13A depicts a cooling system as part of the second cooling circulatory arrangement, and FIG. 13B depicts the second cooling circulatory arrangement being connected to a mains water and drainage. This is equivalent to these portions of the second cooling circulatory arrangement discussed above with respect to FIGS. 4A and 4B.

Accordingly, a system is shown in which heat is removed and transferred away from the first liquid coolant in the first cooling circulatory arrangement by heat transfer to the second liquid coolant in the second cooling circulatory arrangement. The heat transfer primarily takes place at a dedicated heat exchanger 1330 which provide efficient removal of heat from the first cooling circulatory arrangement. The described system allows for efficient cooling of both specific components of the electronic module (by the second cooling circulatory arrangement) but also cooling of the overall volume of the electronic module (by the first cooling circulatory arrangement). The described system is furthermore compact, so as to be able to be used within industry standard server blades or chassis, and can be more easily installed in commonplace server racks, as a result of the closed loop first cooling circulatory arrangement and quick disconnect mechanisms for the second cooling circulatory arrangement.

As such the described system describes an efficient and adaptable system making use of a hybrid arrangement of targeted cooling and cooling of a volume within an electronic module.

Although a specific configuration of two cold plates within an electronic module is shown in FIGS. 1 to 4B above, it will be understood that various cold plate configurations are possible. Moreover, different configurations of the cold plates, and the connection of the associate circulatory system, to a rack (or server) can provide a number of benefits. There is now described a variety of systems for cooling an electronic module configured for installation into a rack, as well as methods of installation of a liquid cooled system for an electronic module. Each of the described configurations incorporates at least one cold plate (as described above with respect to FIGS. 12A, 12B and 12C), and could be combined with the above described embodiments, in particular with respect to incorporation within the second cooling circulatory arrangement.

Figure 14:
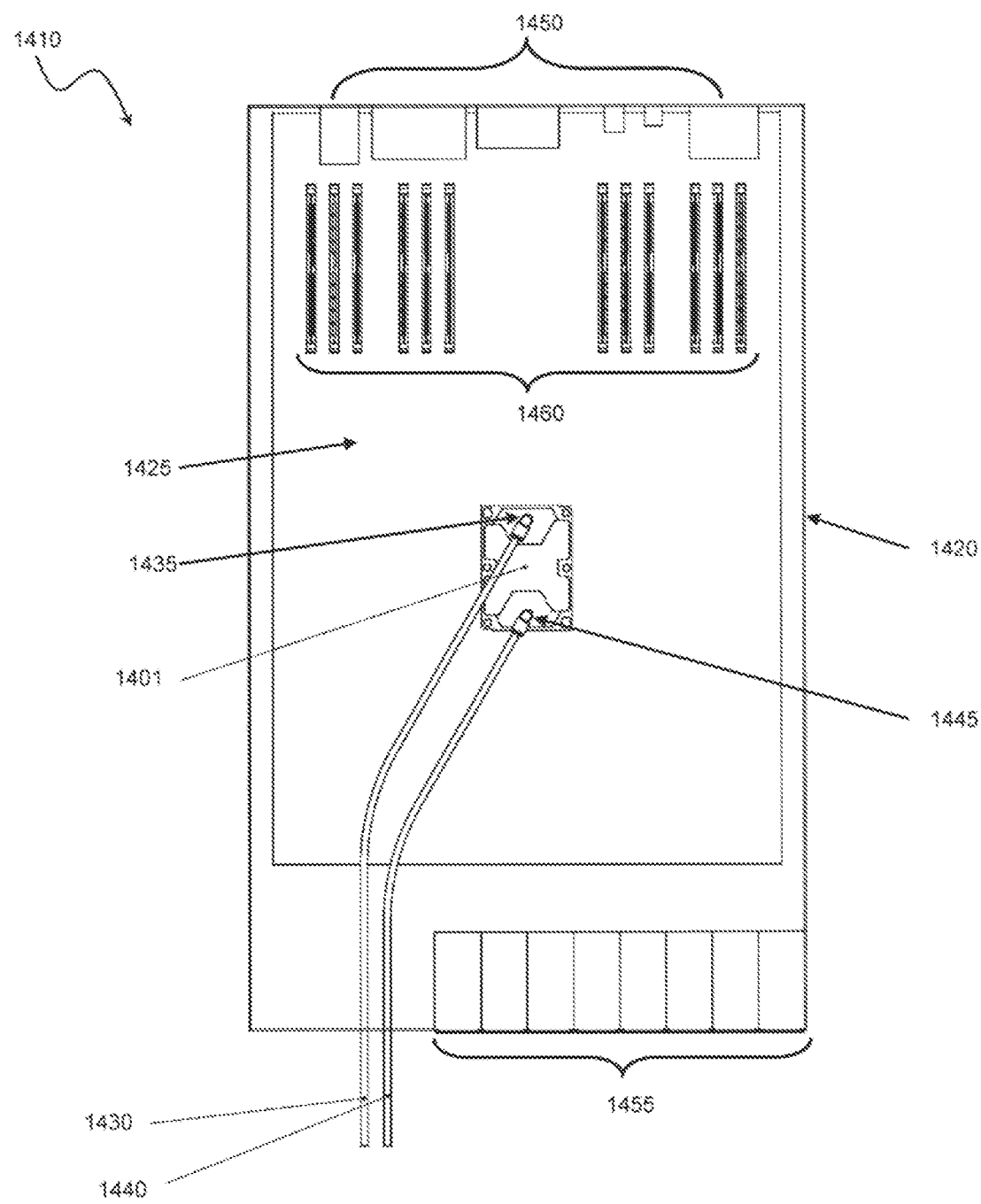
FIG. 14 depicts a plan view of an example electronic module or blade server with an example cold plate mounted within.

FIG. 14 shows a plan view of an electronic module (or server module) in which a cold plate assembly 1401 is arranged. The electronic module is of a type for mounting in an existing rack server system. The cold plate assembly 1401 may be installed in place of a previous air-cooled heat sink module. Advantageously, the cold plate assembly may be installed in the same footprint as the air-cooled heat sink module. Accordingly, the cold plate assembly has the same or similar footprint or dimensions to commonly used air-cooled heat sink modules.

The cold plate assembly 1401 is mounted within the housing or chassis (or server chassis) 1420 of the electronic module 1410. The server chassis 1420 may be for instance a 1RU server chassis, adhering to established industry standards. The base plate of the cold plate module 1401 is arranged to be thermally coupled to an electronic device mounted within the housing. The cold plate module may be mounted directed to the substrate (or printed circuit board) 1425 forming the base of the module housing 1420. Input conduit 1430 is coupled to the inlet port 1435 of the cold plate. Output conduit 1440 is connected to outlet port 1445 of the cold plate. Besides the novel features associated with the cold plate assembly, the illustrated electronic module also shows various other features that would be typical in a standard electronic module, in particular: in/out ports 1450 (including USB, QSFP and Ethernet ports) for electrical or data connections (at the front of the electronic module, if viewed when the module is mounted in a rack), and fans 1455 for air cooling the cavity within the module housing (at the rear of the electronic module, if viewed when the module is mounted in a rack). The module housing may house various electronic components or devices 1460 (RAM chips, etc).

In use, the cold plate assembly 1401 and inlet 1430 and outlet 1440 conduits are connected within a cooling loop, together with a cooling system and pump (not shown in FIG. 14). Liquid coolant is circulated around the cooling loop. Specifically, liquid coolant is passed through the input conduit 1430 into the cold plate assembly 1401. The liquid coolant passes through the channel in the housing of the cold plate assembly, as discussed above in relation to FIGS. 12A, 12B and 12C, in order to receive heat transferred to the liquid coolant from an electronic device thermally coupled to the cold plate housing. As such, the liquid coolant exiting the cold plate assembly 1401 has a higher temperature than liquid coolant entering the cold plate assembly 1401.

Liquid coolant exiting the cold plate assembly 1401 is received through the outlet conduit 1440. The liquid coolant is then transferred through the output conduit 1440 to the cooling system and pump (not shown, and which may comprise a combined unit). At the cooling system, a heat exchanger is provided to transfer heat from the liquid coolant to a second cooling medium. The second cooling medium may be air, for instance, or may be a second cooling loop through which a second liquid coolant is circulating. The cooling system reduces the temperature of, or cools, the liquid coolant. The liquid coolant cooling loop may be formed as part of a large scale cooling facility (such as a building cooling water loop). In an alternative example, the liquid cooling loop may be formed as a smaller loop that is local to the server module, or to the rack to which the server module is connected. The liquid cooling loop can be arranged according to local provision and requirements.

After cooling at the cooling system, the cooled liquid coolant is next circulated further around the cooling loop though the input conduit 1430 to the cold plate module 1401, thereby completing the cooling loop.

As will be understood by the person skilled in the art, various other components may be included within the cooling loop (such as switches, valves, manifolds, or additional pumps). Additional cold plate assemblies may also be comprised within the cooling loop, as described below. The described cooling loop is provided for illustrative purposes, and is not considered to be limiting.

Figure 15:
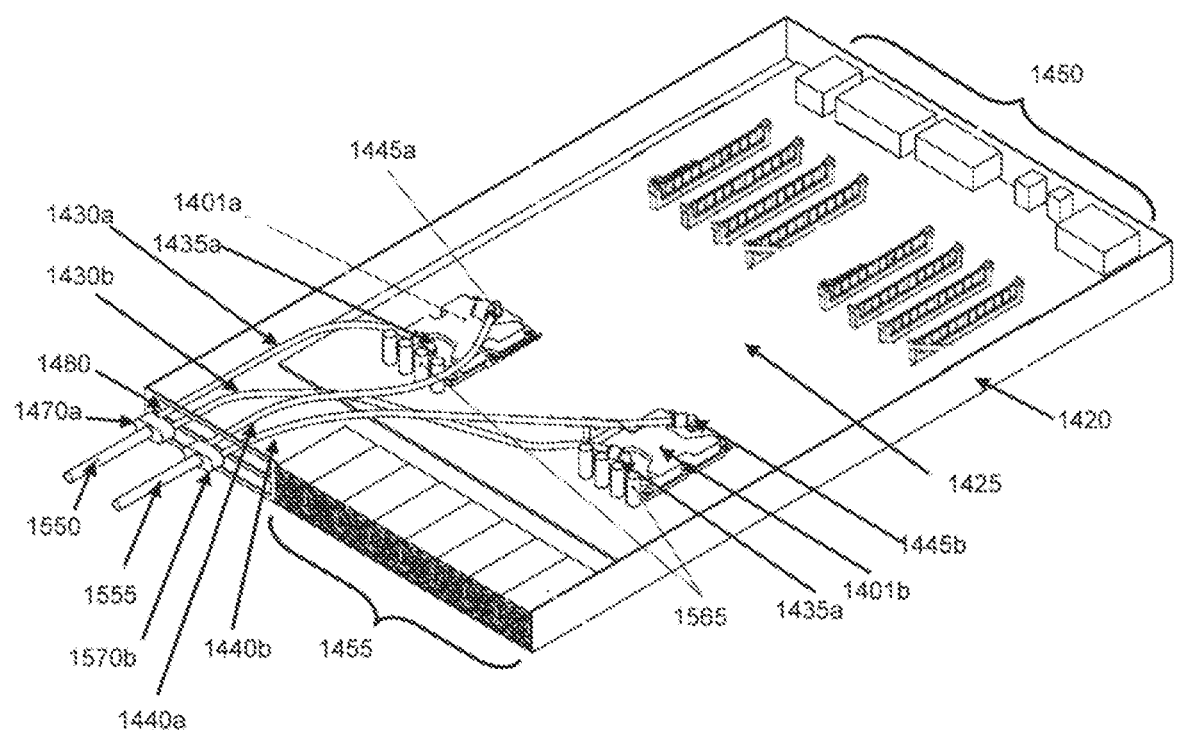
FIG. 15 depicts a perspective view of a second example of an electronic module or blade server with two example cold plates mounted within.
Figure 16:
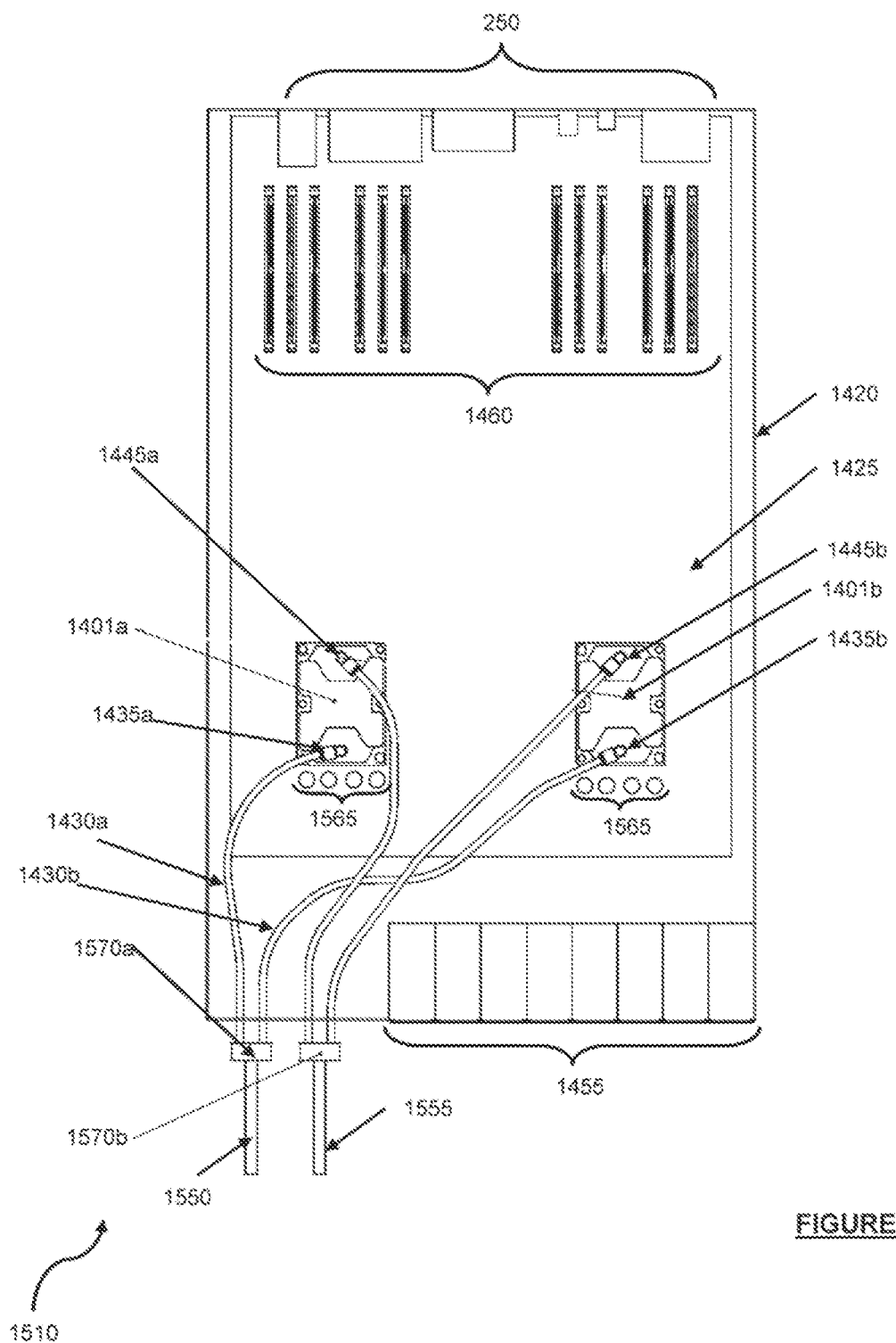
FIG. 16 illustrates a plan view of the second example of the electronic module or blade server of FIG. 15.

FIG. 15 describes a further example of an electronic module (or server module) 1510, in which two cold plate assemblies 1401*a*, 1401*b* are arranged. The same example is depicted in FIG. 16, in plan view. The electronic module 1510 comprises a module housing 1420 with substrate 1425, in/out ports 1450, and fans 1455. Electrical components including computer RAM 1460 and capacitors 1565 are housed within the module housing 1520.

A first inlet 1435*a* and a first outlet 1445*a* port is provided in the lid of the first cold plate assembly 1401*a*. Similarly, a second inlet 1435*b* and a second outlet 1445*b* port is provided in the lid of the second cold plate assembly 1401*b*. A first and second input conduit 1430*a*, 1430*b* is attached to the respective first and second inlet ports 1435*a*, 1435*b*, and a first and second output conduit 1440*a*, 1440*b* is attached to the respective first and second outlet ports 1445*a*, 1445*b*. The first 1401*a* and second 1401*b* cold plate assemblies are arranged within the cooling loop in a parallel configuration. As such a single supply conduit 1550 is connected to both of the first 1430*a* and second 1430*b* inlet conduits. Similarly, a single receiving conduit 1555 is connected to both the first 1440*a* and second 1440*b* output conduits. The supply conduit 1550 could be considered to 'split' into the parallel canals provided by the first and second input conduits, for instance.

At least one coupling 1570*a*, 1570*b* is provided for connection of the supply conduit 1550 to the first 1430*a* and second 1430*b* inlet conduits, and/or for the connection of the first 1440*a* and second 1440*b* output conduit to the receiving conduit 1555. In this example, the couplings 1570*a*, 1570*b* reside outside of the module housing 1420. As such, first 1430*a* and second 1430*b* input conduits and first 1440*a* and second 1440*b* output conduits are arranged to pass through an opening 1480 in the wall of the housing 1420, to transfer the liquid coolant between the inside and outside of the cavity within the electronic module. Advantageously, the opening 1480 is an aperture provided at the rear of a typical server module, for instance an existing PCIE card slot, as illustrated in FIG. 15.

As shown in FIGS. 3 and 4, the input 1430*a*, 1430*b* and output 1440*a*, 1440*b* conduits are arranged around the electrical components 1565, 1460 arranged within the module housing. Beneficially, the conduits are provided by flexible tubing or pipes, having a narrow diameter (or bore size size). As such, the conduits can more easily be fitted around the electrical components. Furthermore, the tubing can be arranged to pass through typically provided, or existing apertures in the wall of the module housing (such as those for an electrical or data port, or for components such as data cards).

The described characteristics of the cold plate assembly 1401a, 1401b are particularly useful when the cold plate assembly is retrofitted, for instance in place of an air-cooled heat sink, as the electrical components are already installed in the module housing, and it is desirable that existing components are not moved or relocated. As such, when retrofitting the cold plate assembly, the fitter can advantageously fit the cold plate module within the foot print of a previous cooling device (as a result of the dimensions of the cold plate assembly), and further, the flexible, narrow tubing used for the conduits together with swivel nozzle at the ports to each cold plate assembly, can allow the installer to assess and apply the most natural route for the tubing through the server chassis and around existing components.

In use, liquid coolant is passed through the supply conduit 1550 to the first 1430a and the second 1430b input conduits, via the coupling 1570a. From here, the first 1401a and second 1401b cold plate assembly form part of separate, first and second parallel branches of the cooling loop. The liquid coolant is circulated through each of the first 1430a and second 1430b input conduits in parallel, to be input through the inlet port 1435a, 1435b of each of the first and second cold plates for the respective first and second input conduit. The liquid coolant then passes through the inner channel of each of the cold plates, receiving heat transferred from the thermally coupled electronic devices, before exiting the cold plate through the outlet ports 1445a, 1445b. The liquid coolant is then transferred to each of the first 1440a and second 1440b output conduits, to join the receiving conduit 1555 at the coupling 1570b.

In use, the supply conduit 1550 and receiving conduit 1555 are connected to a cooling system and/or pump in order to complete the cooling loop, as described above with respect to the example of FIG. 14. The cooling system acts to remove heat from the liquid coolant, therefore removing heat originally transferred from the electrical components out of the cooling loop.

Figure 17:
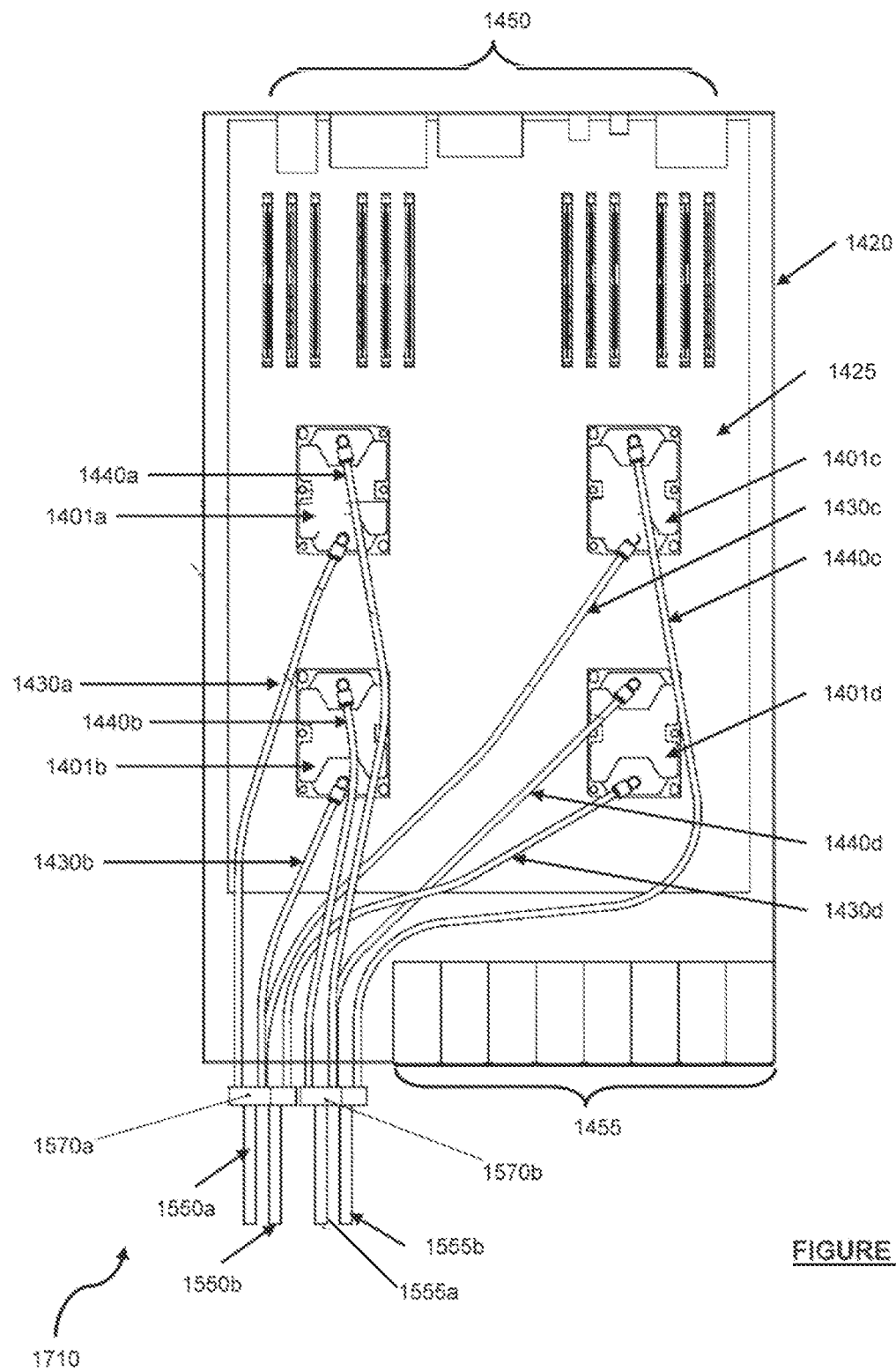
FIG. 17 illustrates a plan view of a third example of an electronic module or blade server with example cold plates mounted within.

FIG. 17 shows a plan view of a further example of an electronic module 1710 including four cold plate assemblies. The configuration of the first 1401a and second 1401b cold plate assembly, and further of the third 1401c and fourth 1401d cold plate assembly is each similar to the arrangement of the first and second cold plate assembly shown in FIGS. 15 and 16.

More particularly, a first 1401a and second 1401b cold plate assembly are connected within a liquid coolant loop in parallel, in a similar arrangement to that described with respect to FIGS. 15 and 16 (although the position of the first 1401a and second 1401b cold plate assemblies on the substrate 1425 of the electronic module are different that those of FIGS. 15 and 16, in order to optimise the arrangement of the tubing forming the first and second input 1430a, 1430b and output 1440a, 1440b conduits). In this example, the supply and receiving conduits represent a first supply 1550a and a first receiving 1555a conduit.

A third 1401c and fourth 1401d cold plates are also provided. The system of the third and fourth cold plate, the third 1430c and fourth 1430d input conduits, and third 1440c and fourth 1440d output conduits are equivalent to those of the first and second cold plate, the first and second input conduits, and first and second output conduits, respectively. As such, the third and fourth cold plate assemblies 1401c, 1401d are connected within a liquid coolant loop in parallel. The third 1430c and fourth 1430d input conduits are coupled to, and receive liquid coolant from, a second supply conduit 1550b. Similarly, the third 1440c and fourth 1440d output conduits are coupled to, and transfer liquid coolant to, a second receiving conduit 1555b.

The first and second supply conduit 1550a,b shown in FIG. 17 may be connected in parallel within the liquid cooling loop. In other words, a single output from the cooling system of the cooling loop may be split to each connect to the first 1550a and second 1550b supply conduit. Similarly, the first 1555a and second 1555b receiving conduit can be connected in parallel, such that the first and second receiving conduit join to pass to the input of the cooling system as a single entity.

In an alternative example, the first 1550a and the second 1550b supply conduit and the first 1555a and the second 1555b receiving conduit may be connected in separate, respective first and second cooling loops, each having a cooling system. This may provide a greater cooling power than the arrangement discussed above in which first and the second supply conduit 1550a,b and the first and the second receiving conduit 1555a,b are arranged in series. However, it also requires a more complex infrastructure, and may be more costly. The specific configuration for the cooling loop connected to the apparatus illustrated in the example of FIG. 17 (and other examples depicted herein) may be selected according to the cooling requirements and infrastructure of a particular server facility.

Figure 18:
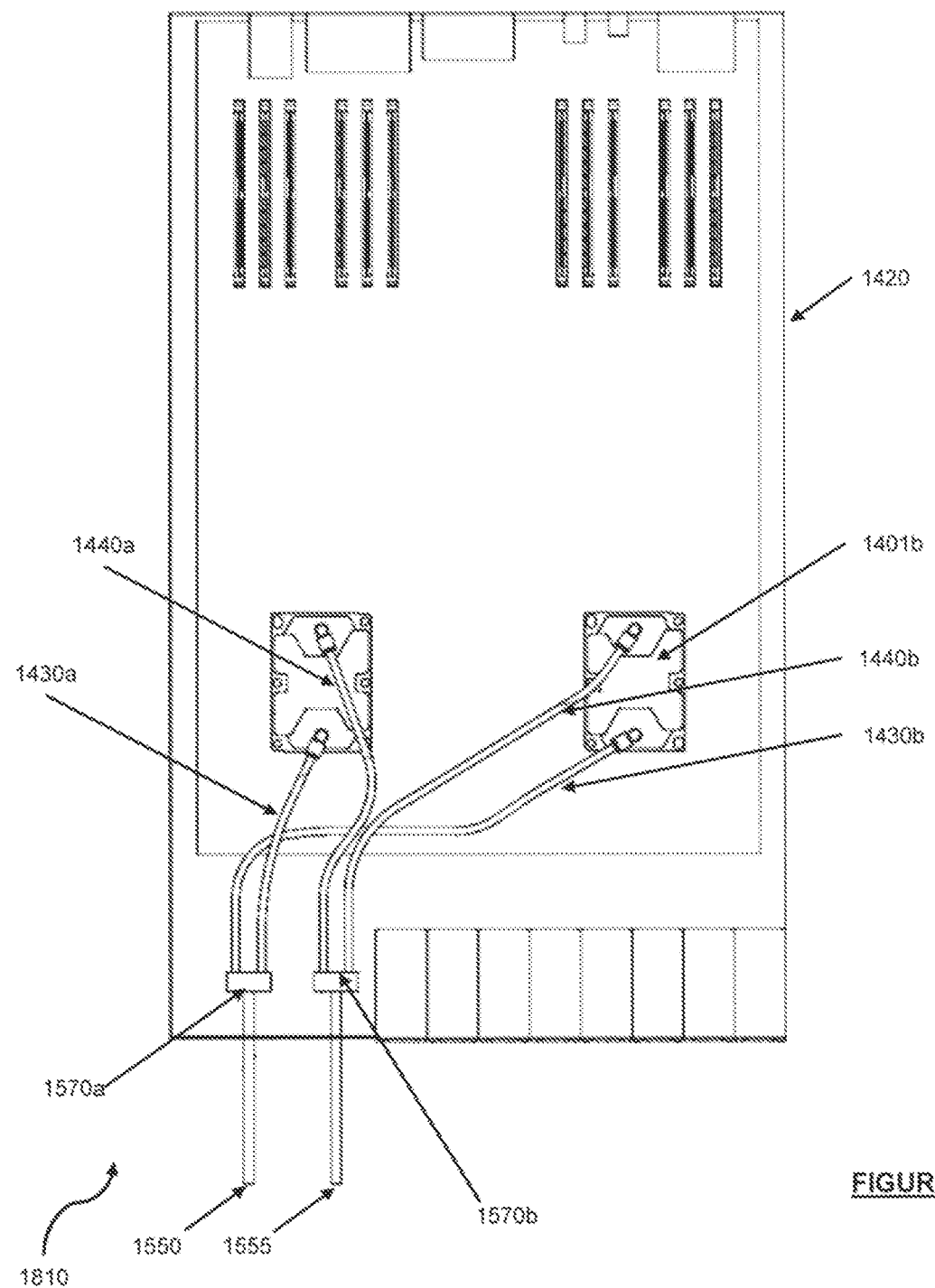
FIG. 18 illustrates a plan view of a fourth example of an electronic module or blade server with example cold plates mounted within.

FIG. 18 depicts an electronic module 1810 in which a first 1401a and a second 1401b cold plate assembly is mounted. In this example, the first and second cold plates are arranged in the cooling loop in parallel, having first 1430a and second 1430b input conduits, first 1440a and second 1440b output conduits, couplings 1570a, 1570b and source 1550 and receiving 1555 conduits arranged in much the same manner as FIGS. 15 and 16. However, in this example, the couplings 1570a, 1570b at which the first 1430a and second 1430b input conduits are coupled to the supply conduit 1555, and at which the first 1440a and the second 1440b output conduits are coupled to the receiving conduit 1555, are arranged within the module housing 1420. In this case, the source 1550 and receiving conduits 1555 are arranged to pass through an opening in the module housing.

Compared to the arrangement in FIGS. 15 and 16, this configuration benefits that fewer pipes or tubes must be fed-though the wall of the module housing. However, in order to maintain a generally efficient flow of liquid coolant though the first and second cooling assembly, the source and receiving conduits will typically be provided by tubes having a larger bore size or diameter than each of the first and second input and output conduits. Therefore, in some scenarios, placing the coupling within the module housing (as shown in the example of FIGS. 15 and 16) may be preferable, as it allows for greater flexibility in the placement of the feedthrough of each conduit.

Figure 19:
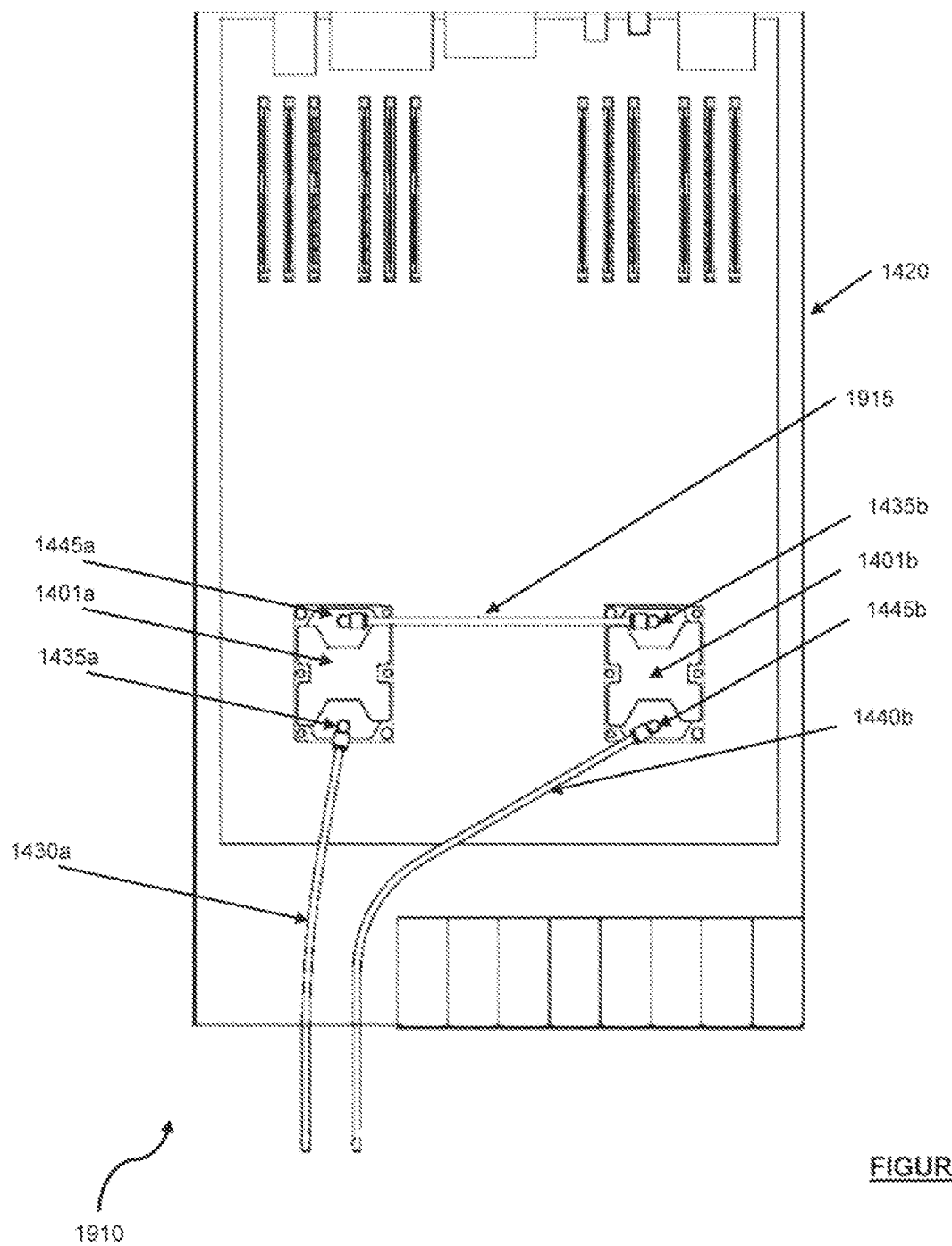
FIG. 19 illustrates a plan view of a fifth example of an electronic module or blade server with example cold plates mounted within.

FIG. 19 depicts a plan view of an electronic module 1910 housing a first 1401a and second 1401b cold plate. However, compared to previous examples, the first 1401a and second 1401b cold plate are arranged in series within the cooling loop. As such, although a first input conduit 1430a is connected to a first inlet port 1435a of the first cold plate, and a second output conduit 1440b is connected to the outlet port 1440b of the second cold plate, as before, in this case the first outlet port 1445a is coupled directly to the second inlet port 1435b via a link conduit 1915. The first input conduit 1430a and the second output conduit 1440b are arranged to pass through an opening in the wall of the module housing 1420. The first input conduit 1430a and the second output conduit 1440b are subsequently connected to the cooling loop as previously described.

In use, the liquid coolant is transferred through the first input conduit 1430a to be received at the inlet port 1435a of the first cold plate 1401a. The liquid coolant passes through the channel of the first cold plate, receiving heat transferred from an electronic device thermally coupled thereto. The cooling liquid then passes out of the first cold plate via the first outlet port 1445a, to be transferred thought link conduit 1915 to the inlet port 1435a of the second cold plate 1401b. The liquid coolant then further passes through the channel of the second cold plate, receiving heat transferred from an electronic device thermally coupled to the second cold plate. The liquid coolant is then passed out of the second cold plate via the second outlet port 1445b, to the second output conduit 1440b. The liquid coolant is further circulated towards a cooling system within the cooling loop.

In the series connected cold plates of FIG. 19, the liquid coolant has a first temperature before entry to the first cold plate (i.e. in the first input conduit 1430a), a second temperature after exit from the first cold plate and before entry to the second cold plate (i.e. in the link conduit 1915), and a third temperature after exiting the second cold plate (i.e. in the second output conduit 1440b). The first temperature will be lower than the second temperature, and the second temperature will be lower than the third temperature. In other words, the liquid coolant becomes progressively hotter as it passes through additional cold plates, in view of the heat transferred within the channel of each cold plate.

The efficiency of transfer of heat from an electronic device to the liquid coolant in a channel of a cold plate is dependent on the temperature gradient (or the differential temperature) between the electronic device and the liquid coolant. Therefore, where the temperature of the liquid coolant is higher, and so closer to the operating temperature of the electronic device, the heat transfer from the electronic device to the liquid coolant (i.e. the cooling) may become less efficient. As such, in the series configuration of the cold plates shown in FIG. 19, an electronic device thermally coupled to the first cold plate 1401a may be more efficiently cooled than an electronic device thermally coupled to the second cold plate 1401b. However, the series configuration of cold plate modules is more compact and requires fewer pipes and tubes to act as conduits. Moreover, the maximum possible cooling efficiency may not be required for every electronic device within a given electronic module. Therefore, the sequence of cold plate modules in the series configuration may be chosen to provide sufficient cooling to each electronic device to be cooled.

The difference in efficiency of the cooling between the first and second cold plates described in FIG. 19 can be effectively overcome by provision of each of the cold plate in parallel within the cooling loop as shown in the examples of FIGS. 15, 16, 17 and 18, for instance. In the parallel configuration, the temperature of the liquid coolant circulating through each cold plate is the same. Therefore, each cold plate, attached within each parallel branch of the cooling loop, has the same potential cooling efficiency for an electronic device operating at a given temperature.

Nevertheless, the parallel configuration described may be more cumbersome to install within a server blade (especially where the cooling system is retrofitted), as a larger number of conduits (pipes or tubes) and couplings are required to achieve a parallel configuration, particularly as more cold plates are added within a specific electronic module or server blade. A greater number of conduits may need to be fed through existing apertures or opening in the wall of the module housing, in order to service the cold plate modules arranged in parallel. Therefore, in some cases, a series arrangement of cold plate modules may be preferable to a parallel configuration of cold plate modules, dependent on the specific space considerations and cooling requirements of a particular electronic module.

Figure 20:
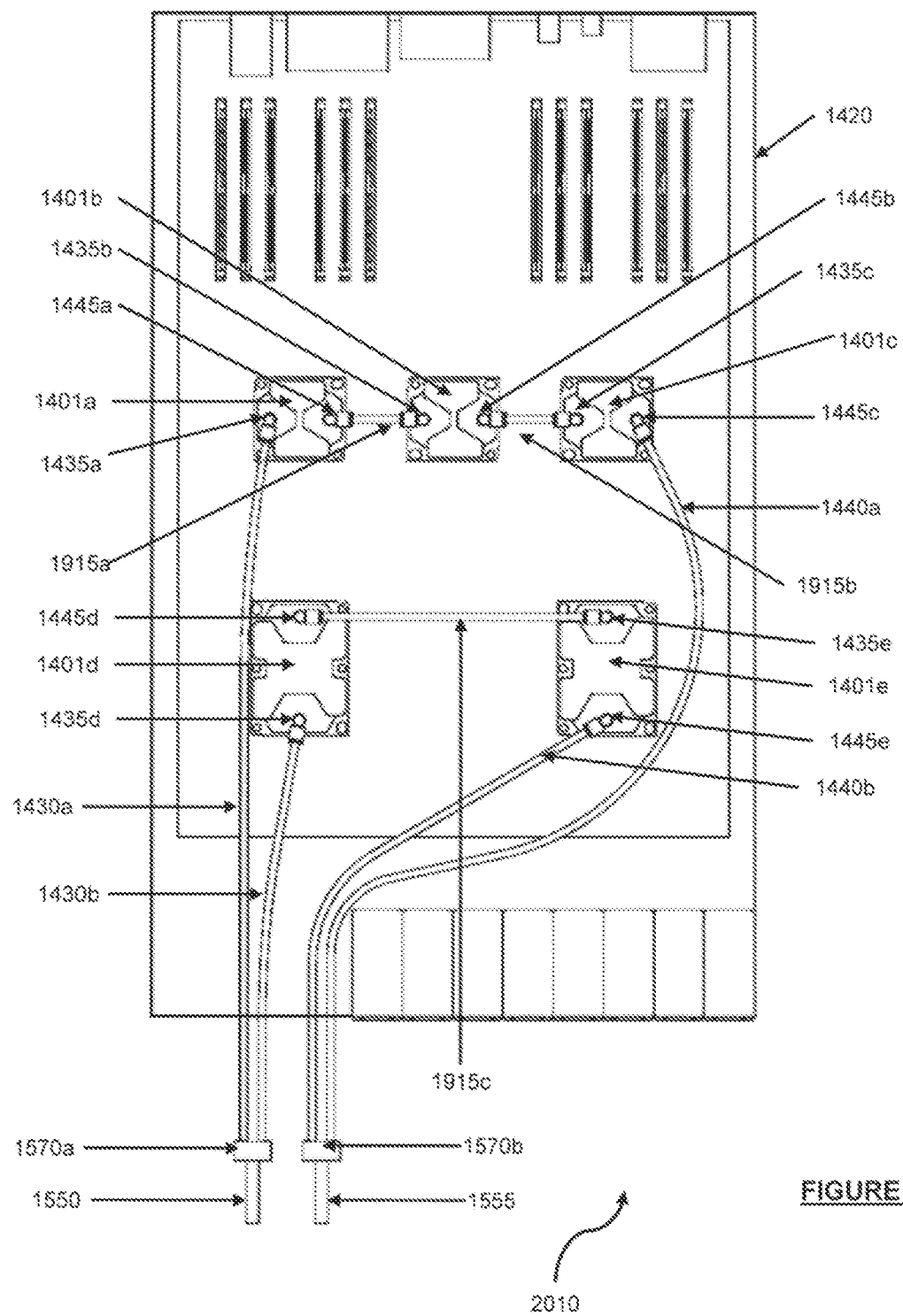
FIG. 20 illustrates a plan view of a sixth example of an electronic module or blade server with example cold plates mounted within.

With this in mind, FIG. 20 depicts a further example of a liquid cooling system installed within an electronic module 2010. In this example, two parallel branches of a cooling loop circulate though cold plates mounted within the electronic module. On the first branch of a cooling loop a first, a second and a third cold plate are arranged in series. On a second branch of the cooling loop, a fourth and a fifth cold plate are arranged in series. The footprint and volume of each of the cold plates on the first branch (the first, second and third cold plate) is smaller than the footprint and the volume of each of the cold plates on the second branch (the fourth and fifth cold plate). The cooling power of the larger cold plates (the fourth and fifth cold plate) may be greater than that of the smaller cold plates (the first, second and third cold plate), as they provide a larger surface area for transfer of heat from an electronic device to the cooling liquid. However, the cooling power will be in some part limited by the rate of flow of liquid coolant through each branch of the cooling loop (which may in turn be determined by the bore size or diameter of the pipes forming the conduits for connection of the cold plates).

The specific liquid cooling system of FIG. 20 comprises first 1401a, second 1401b, third 1401c, fourth 1401d and fifth 1401e cold plates. Each cold plate has respective inlet and outlet ports. A supply conduit 350 provides a passage for liquid coolant received from a cooling system, prior to splitting into the two parallel branches of the cooling loop. In the first branch from the supply conduit, a first input conduit 1430a is arranged to transfer liquid coolant to the inlet port 1435a of the first cold plate, a first link conduit 1915a is arranged to transfer liquid coolant from the first outlet port 1445a of the first cold plate to the second inlet port 1435b of the second cold plate, a second link conduit 1915b is arranged to transfer liquid coolant from the second outlet port 1445b of the second cold plate to the third inlet port 1435a of the third cold plate, and a first output conduit 1440a is arranged to transfer liquid conduit from the outlet port 1445c of the third cold plate to a coupling 1570b with the receiving conduit 1555. In the second branch from the supply conduit (arranged in parallel to the first branch), a second input conduit 1430b is arranged to transfer liquid coolant to the inlet port 1435d of the fourth cold plate, a third link conduit 1915c is arranged to transfer liquid coolant from the outlet port 1445d of the fourth cold plate to the inlet port 1435e of the fifth cold plate, and a second output conduit 1440b is arranged to transfer liquid coolant from the outlet port 1445e of the fifth cold plate to a coupling with the receiving conduit 1555.

In use, liquid coolant is circulated around each branch of the cooling loop. Comparatively cooler liquid coolant is supplied by the supply conduit to the input conduit of each branch, with comparatively hotter liquid coolant being received at the receiving conduit from each of the output conduits of each branch. A pump and a cooling system (as described above) can be arranged between the receiving conduit and the supply conduit within the cooling loop, in order to circulate the liquid coolant and to transfer heat out of the liquid coolant.

As will be understood, any number of configurations for the cold plates and cooling loop could be arranged based on the examples outlined. More than two parallel branches of the cooling loop could be arranged within an electronic module, and any number of cold plates could be arranged in series on each branch of the cooling loop. The specific arrangement will be selected according to the cooling requirements of a particular electronic module, and in view of the space and configuration restrictions of the electronic module (especially when retrofitting the described cooling system into an existing electronic module). The specific arrangement may be selected (for instance, by an installer) to optimise the efficient cooling of the electronic module in view of these requirements and restraints.

Figure 21:
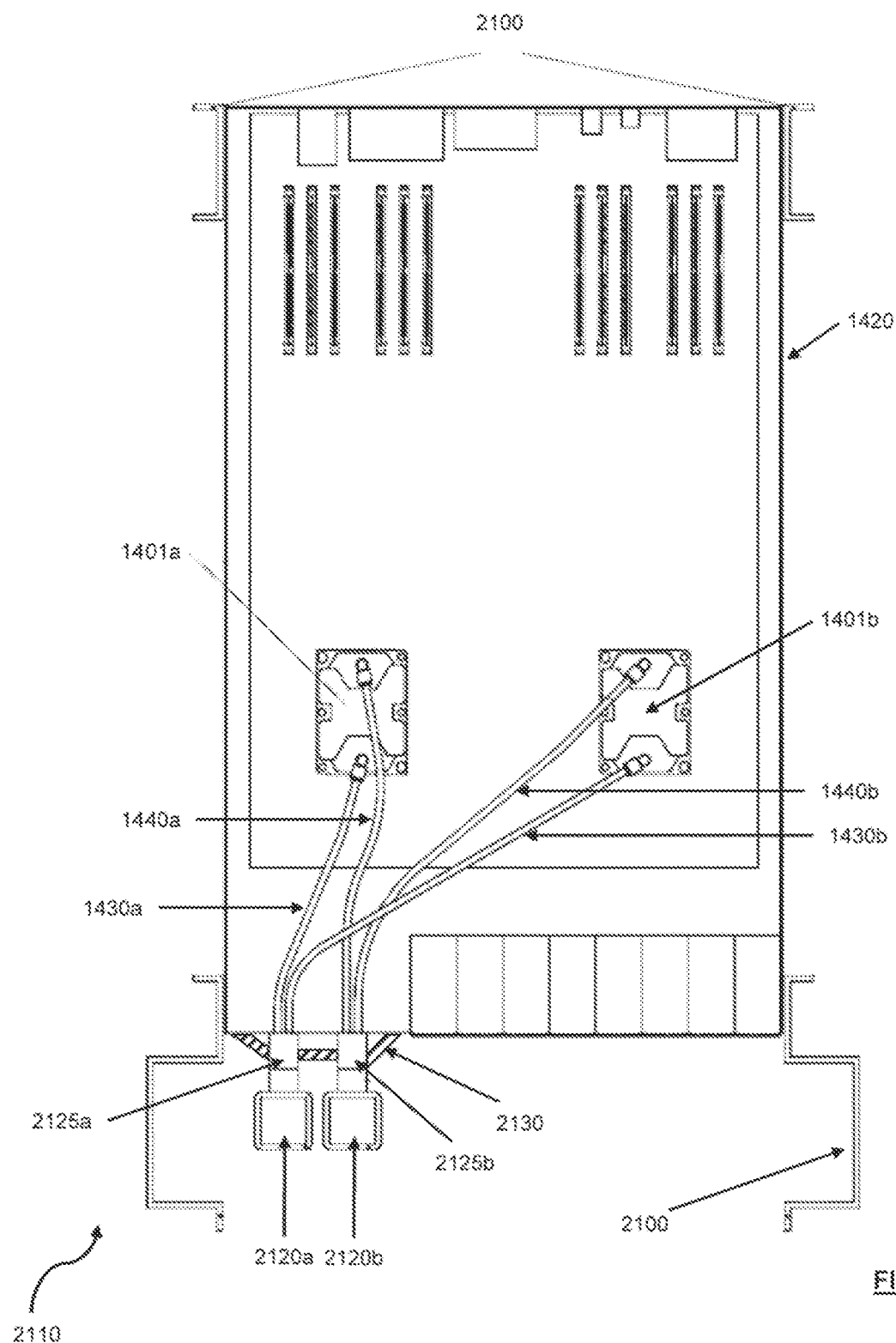
FIG. 21 illustrates a plan view of a seventh example of an electronic module or blade server with example cold plates mounted within, including a manifold.

FIG. 21 shows a plan view of a further example for the cooling system installed within an electronic module 2110. The electronic module 2110 is shown mounted within a rack 2100. In this example, a first 1401a and second 1401b cold plate are arranged in parallel within a cooling loop. Within the boundary of the module housing 1420, the configuration of a first 1430a and second 1430b input conduit, a first 1440a and second 1440b output conduit and the first and second cold plates are the same as described above with respect to the example of FIGS. 15 and 16. However, in this example, a first 2120a and second 2120b manifold are provided external to the electronic module. The first manifold 2120a is coupled to the first 1430a and second 1430b input conduits, and the second manifold 2120b is coupled to the first 1440a and second 1440b output conduits. It will be understood that a source and receiving conduit will be connected to the first and second manifold, respectively, each having a similar function within the cooling loop as the source and receiving conduit described above with respect to FIGS. 15 and 16. In FIG. 21, the source and receiving conduits are not visible, being connected to the manifolds perpendicular to the direction of flow of the liquid coolant in the input and output conduits (i.e. the flow of the liquid coolant through the source and receiving conduits will be into/out of the plane of the electronic module in FIG. 21).

Each manifold provides a unit having a passage or channel for supply of liquid coolant to the conduits. The passage or channel within the manifold may have a wider diameter or bore size than the conduits, in order to avoid limitation to the flow rate of the liquid coolant through manifold. The manifold unit made be rigid, allowing easier fixture to the electronic module or rack than a simple coupling between flexible tubing (as show with respect to couplings 1570a, 1570b in FIGS. 15 and 16, for instance). Furthermore, provision of a rigid manifold as a point of coupling of the input and output conduits to the respective supply and receiving conduits reduces strain on the coupling, and so helps to prevent leaks of liquid coolant, or reduction of pressure in the liquid cooling loop. Finally, use of the described manifold aids in the installation and fitting of the cooling system, as it allows for decouplable connection between conduits, and so flexibility in the arrangement of the various components of the cooling system.

The manifold may be supported by a bracket 2130, which in the example of FIG. 21 is connected to the rear of the module housing. In an alternative example, the bracket may be connected to the rack.

Each of the first and second input conduits are connected or coupled to the first manifold using connectors 2125a, 2125b, and more specifically blind mate connectors, although other types of connector could be used. Blind mate connectors have a mating action that is 'push-fit', in other words by sliding or snapping the connector plug into the socket. As such, the connectors are easier to fit, without the use of tools such as wrenches. Moreover, no torque needs to be applied to the tubing or pipes providing the conduit when fitting (which allows for greater control of the arrangement of the conduits within the cooling system). Furthermore, the blind mate connectors have self-aligning features which allows resilience to a small misalignment when mating. Thus, this type of connector provide greater ease of fitting the cooling system, especially when installed into existing electronic modules in place of an air cooled heat sink system.

Figure 22:
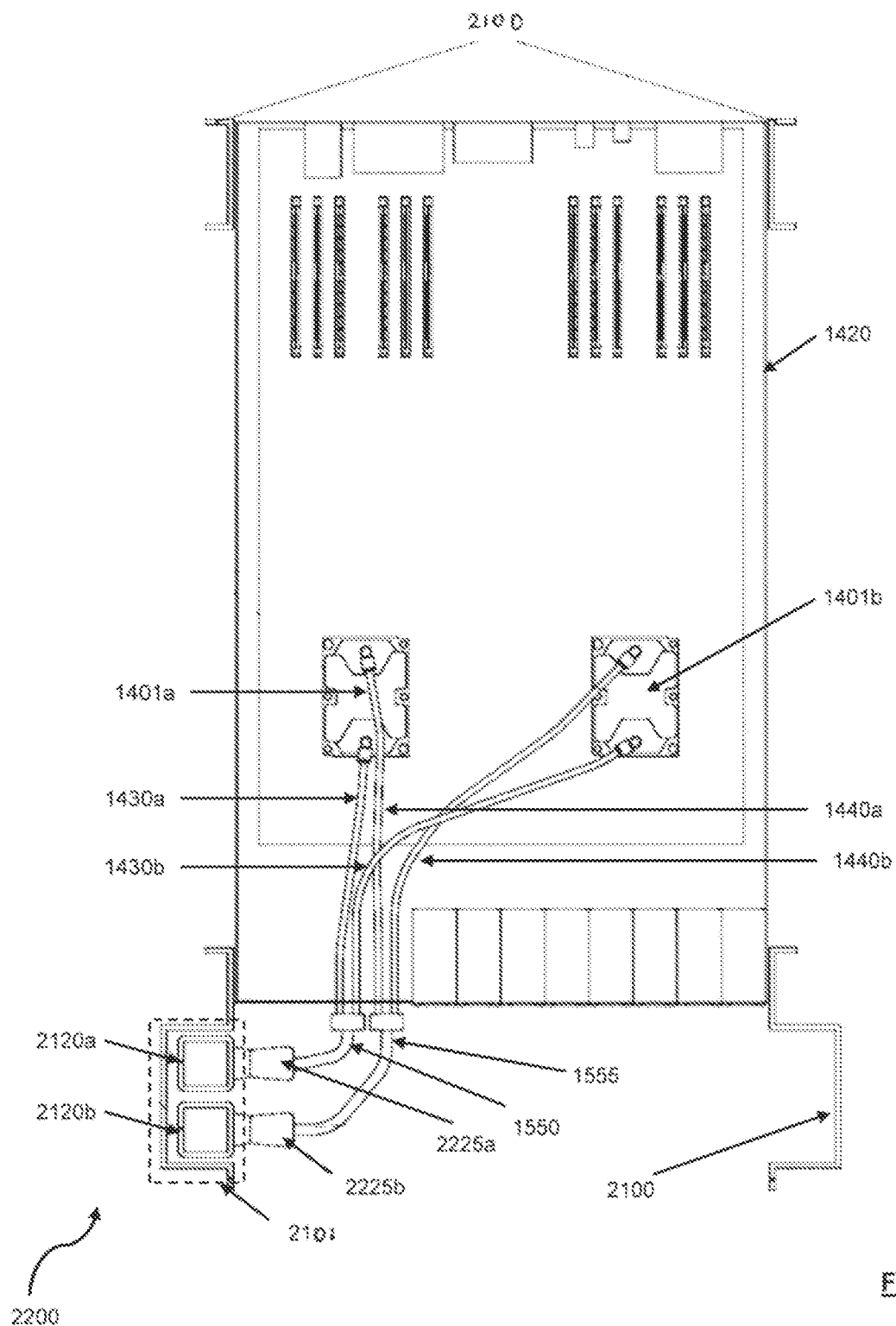
FIG. 22 illustrates a plan view of an eighth example of an electronic module or blade server with example cold plates mounted within, including a manifold.

FIG. 22 depicts a plan view of a further example of the cooling system installed within an electronic module 2200. This example also includes a manifold, but in a further configuration compared to that shown in FIG. 21. The cooling system of FIG. 22 comprises first 1401a and second 1401b cold plates, arranged in parallel within the cooling loop. The arrangement of the first 1401a and second 1401b cold plate, the first 1430a and second 1430b input conduit, the first 1440a and second 1440b output conduit, and the source 1550 and receiving 1555 conduits are identical to those described above with respect to the examples of FIGS. 15 and 16.

In the example of FIG. 22, the source 1550 and the receiving 1555 conduits are each connected to a respective first 2120a and second 2120b manifold. The manifolds may connect the source and receiving conduits into the cooling loop, as previously described. Similar to the manifold discussed above with respect to FIG. 21, the manifolds 2120a, 2120b are units or elements having a passage or channel for supply of liquid coolant to the conduits. They may be rigid, and provide the various benefits outlined above.

The supply and receiving conduits may be connected to the manifolds via connectors 2225a, 2225b. Said connectors may be manual connectors, for instance, which require manual connection during installation (or manual disconnection in order to remove the electronic module from the rack). Such connectors are relatively simple to install, and less complex than other types of connector. Therefore, this type of drip-free, manual connector may be particularly useful when retrofitting the described cooling system to an existing electronic module.

In the example of FIG. 22, the first 2120a and second 2120b manifold are supported by the rack 2100. More particularly, the first 2120a and second 2120b manifold are mounted within a duct (or passageway, or cavity) 2101 provided in a typical rack for housing electrical and data cables. The duct 2101 provides a cavity adjacent to the rear of the electronic module 2100, such that the first 2120a and second 2120b manifold mounted within are housed in a compact and secure fashion. Beneficially, this arrangement for housing the manifolds 2120a, 2120b does not necessarily require any additional brackets or infrastructure to be provided for support of the manifold, and still securely and robustly affixes the manifolds in place.

It is noted that the manifolds described above with respect to FIGS. 21 and 22 are shown as separate manifold units for each of the input and outlet portions of the cooling loop. It will be understood that both input and outlet portions may be serviced by a single manifold unit with appropriate partition therein. Nevertheless, separate manifolds for each of the input and outlet portions may be beneficial to provide additional flexibility in the arrangement of the manifolds, especially when retro-fitting the cooling system to an existing server blade.

Figure 23:
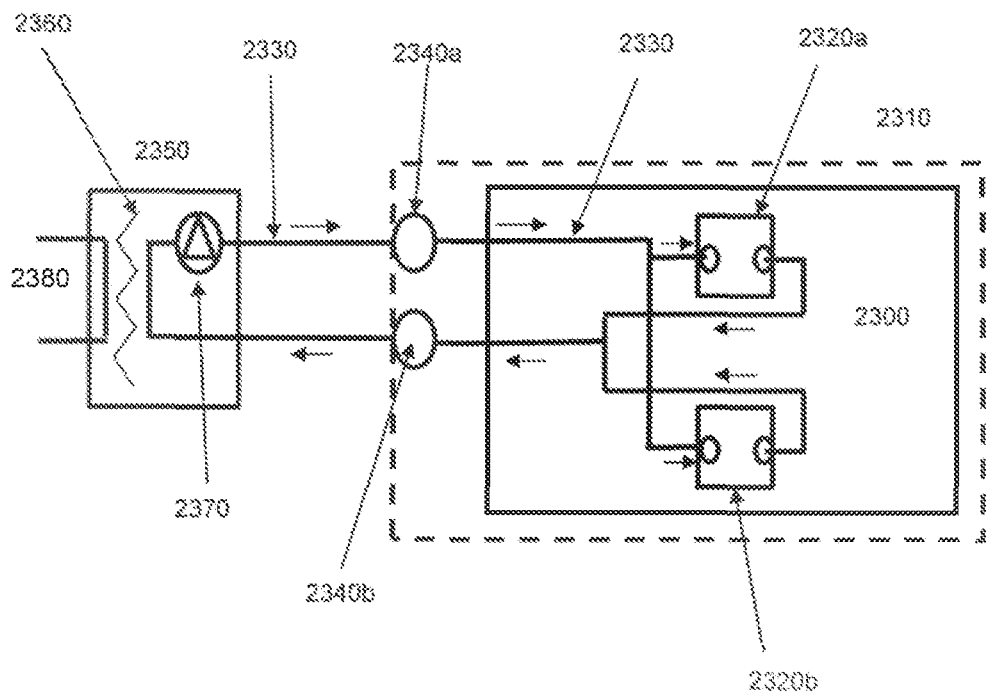
FIG. 23 a schematic view of an example of a single rack server cooling system in accordance with the disclosure.

A cooling loop, of which the described cold plate apparatus form a part, has been described above. FIG. 23 depicts a schematic view of a specific configuration of a full cooling loop, by way of example. FIG. 23 shows: an electronic module or server chassis 2300; a first 2320a and a second 2320b cold plate in accordance with the present disclosure; a water-based cooling loop 2330 (which is the "cooling loop" circulating through the cold plates, as described with reference to the examples above); a first and second manifold 2340a, 2340b; and a cooling distribution unit (CDU) 2350 comprising a heat exchanger 2360 (or cooling system) for transfer of heat from the liquid coolant in liquid cooling loop 2330 to a heat sink 2380. A facility level pump 2370 is used to distribute coolant to all the cold plates 2320a, 2320b in the cooling loop 2330. The electronic module or server chassis 2300 may be mounted within a rack 2310, with the manifolds 2340a, 2340b being mounted to the rack and also being used to direct coolant to and from other servers (not shown). The manifold may be mounted within a duct of the rack for storage and passage of electronic and data cables, as illustrated in FIG. 22.

It will be understood that although the pump and heat exchanger are shown within a unit (a CDU) in FIG. 23, instead a separate cooling system (or heat exchanger) and pump could be implemented within cooling loop 2330.

Figure 24:
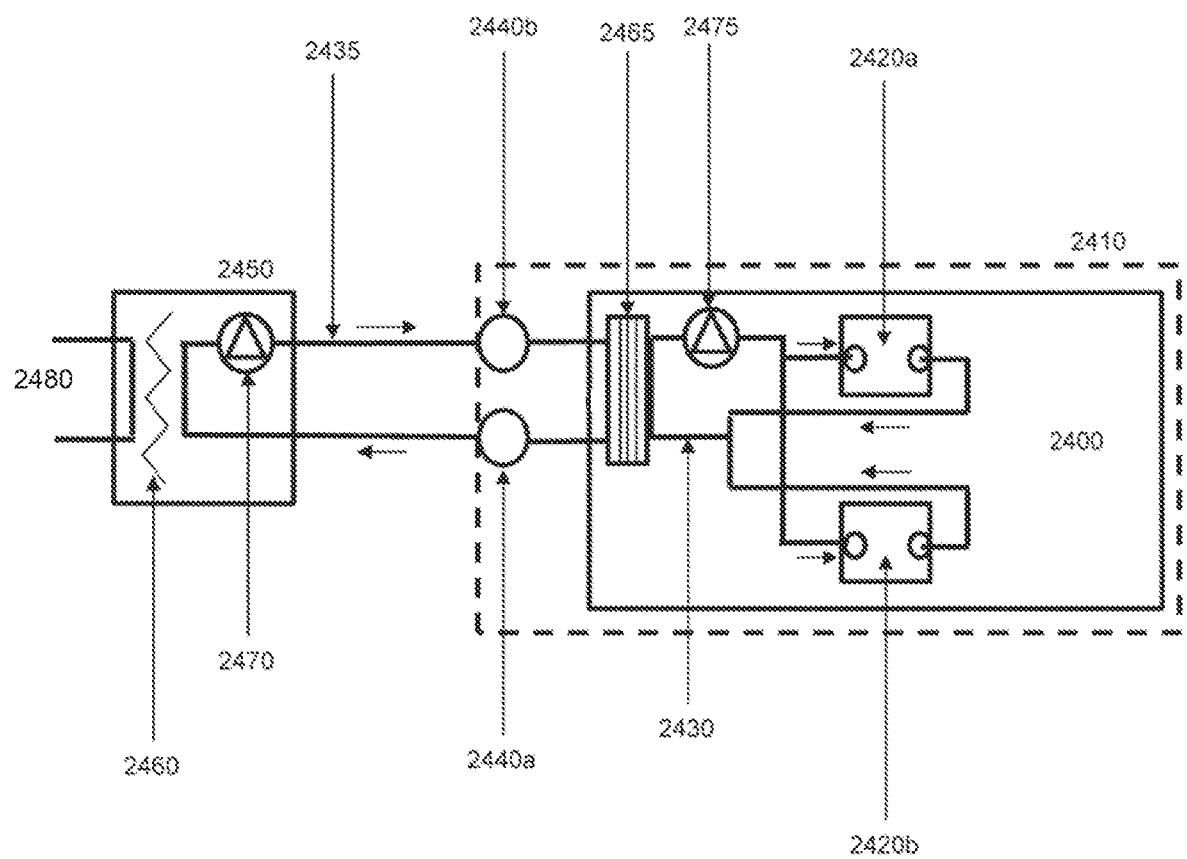
FIG. 24 a schematic view of a further example of a single rack server cooling system in accordance with the disclosure.

FIG. 24 shows an alternative example for the cooling loop of which one or more cold plates described in the examples above may form a part. FIG. 24 depicts a schematic view of the electronic module 2400 mounted in a rack 2410, including: a first 2420a and a second 2420b cold plate in accordance with the present disclosure; a first cooling loop 2430 (which is the "cooling loop" circulating through the cold plates, as described with reference to the examples above); a cooling system comprising heat exchanger 2465, a first pump 2475, a second cooling loop 2435, a first and a second manifold 2440a, 2440b; and a cooling distribution unit (CDU) 2450 comprising a heat exchanger 2460 for transfer of heat to a heat sink 2480 and a facility level pump 2470.

In this example, the first cooling loop 2430 (or "cooling loop", as described with respect to FIGS. 13 to 22 above) circulates through the cold plates 2420a, 2420b, and is entirely contained within the chassis of the electronic module 2400. The first cooling loop 2430 is circulated by pump 2475, which is also housed within the chassis. The first cooling loop 2430 is connected to a cooling system which here comprises a heat exchanger 2465 for transfer of heat from the liquid coolant circulating in the first cooling loop to a cooling medium (for instance water, or another liquid coolant) circulating in the second cooling loop 2435. In this way, heat is removed from the first cooling loop 2430. The cooling system in this example is also housed within the chassis of the electronic module 2400.

Second cooling loop 2435 circulates between the heat exchanger and the cooling distribution unit. Circulation may be effected by pump 2470 within the CDU. The second cooling loop 2435 may be a facility level cooling loop (i.e. a building water cooling loop). Alternatively, it could be local to the electronic module, to the rack of electronic modules, to the server room in which the modules are housed, for instance. The second cooling loop may pass through manifolds 2440a, 2440b, which are mounted to the rack 2410. In an alternative, manifolds could be mounted to the electronic module.

At the CDU, heat is transferred from the second cooling loop 2435 via heat exchanger 2460. The heat is transferred to a heat sink 2480. It will be understood that the heat sink 2480 could represent an air-cooled heat sink. Alternatively, the heat sink 2480 could form part of a further (third) cooling loop, through which liquid coolant is circulated. This may be appropriate where the second cooling loop is local to a specific rack of electronic modules, and the third cooling loop is a facility level cooling loop (such as a building water cooling loop).

As will be understood by the person skilled in the art, electronic modules such as those discussed above with respect to FIGS. 14 to 24 are configured to be fitted into racks. In particular, each rack can house a plurality of electronic modules. In this way a bank of electronic modules are formed, for example each providing a server within a server bank. The cooling systems, discussed above with respect to individual electronic modules, therefore form part of a larger cooling system that may serve a plurality of electronic modules in a rack, or in one or more racks.

Figure 25:
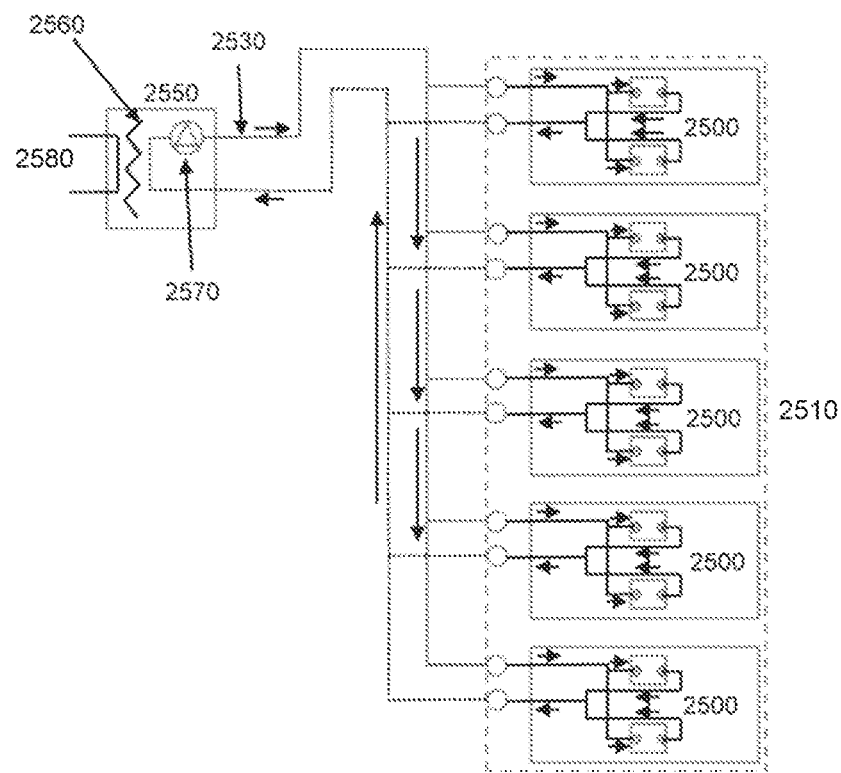
FIG. 25 shows a schematic view of a multi-server cooling system in accordance with the disclosure.

FIG. 25 shows a schematic view of an example cooling system comprising a plurality of electronic modules, each with a cooling system installed. FIG. 25 shows a server chassis or electronic module 2500 mounted within a rack 2510. Multiple racks may be provided, each of which can house up to 42 electronic modules 2500. In this example, a water-based cooling loop 2530 is provided across all electronic modules 2500. The cooling loop 2530 is cooled using a single coolant distribution unit (CDU) 2550. The CDU 2550 includes a heat exchanger 2560 and a facility-level pump 2570, with heat being transferred to a heat sink 2580. The heat sink 2580 may itself be air cooled. Alternatively, the heat sink 2580 may form part of a second coolant loop (not shown). In either case, the heat exchanger assists in transfer of heat from the liquid coolant circulating in the cooling loop 2530. Thus, a single pump 2570 can be used in a system with a plurality (even hundreds) of electronic modules 2500.

It is noted that each of the server chassis or electronic modules 2500 shown in FIG. 25 are configured with a cooling loop according to server chassis or electronic module 2300 shown in greater detail in FIG. 23. However, it will be understood that each of the electronic modules 2500 in FIG. 25 could instead have a configuration according to the electronic module 2400 shown in FIG. 24. In particular, each electronic module 2500 of FIG. 25 could include a cooling system (comprising at least a heat exchanger 2465, to transfer heat to a second cooling loop 2435) and a pump 2475 within the body of the electronic module or server chassis, according to the illustrated electronic module 2400 of FIG. 24.

In summary, a range of benefits are provided by embodiments in accordance with the disclosure. These are particularly advantageous in a cold plate for cooling electronics cooling in dense applications (for example 1U sized servers in multiple racks) and ultra-dense applications. A particular benefit is provided by the adaptability and configuration of the described cooling system, which makes it particularly appropriate to retrofitting to existing electronic modules or server rack systems. Furthermore, the described system can be applied to standard or typical server chassis or server racks, without complex customisation.

Moreover, any of the described configurations for the cold plates in FIGS. 14 to 25 could be applied to the first and second cooling circulatory arrangements, as discussed above with respect to FIGS. 1 to 4B. In particular, the described first cooling circulatory arrangement could be combined with any of the described cold plate configurations discussed with reference to FIGS. 14 to 25 (and implemented as the second cooling circulatory arrangement), with the addition of a suitable heat exchanger 170 for transfer of heat between the first and the second cooling circulatory arrangements.

A number of combinations of the various described embodiments could be envisaged by the skilled person. All of the features disclosed herein may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

The invention claimed is:

1. A system for cooling a plurality of electronic devices housed in a housing of an electronic module, the system comprising:
   a first cooling circulatory arrangement, configured to circulate a first liquid coolant between a first electronic device of the plurality of electronic devices and a heat exchanger, the first electronic device being in contact with the first liquid coolant such that heat is transferred from to the first liquid coolant from a surface of the first electronic device with which the first liquid coolant is in contact; and
   a second cooling circulatory arrangement, configured to circulate a second liquid coolant between a second electronic device of the plurality of electronic devices and the heat exchanger, the second electronic device being thermally coupled to the second liquid coolant such that heat is transferred from the second electronic device to the second liquid coolant;
   wherein the first cooling circulatory arrangement and the second cooling circulatory arrangement are thermally coupled at least via the heat exchanger, such that heat is transferred from the first liquid coolant to the second liquid coolant via the heat exchanger;
   wherein the heat exchanger comprises at least a first and a second chamber separated by a thermal interface, wherein the heat exchanger is configured for flow of the first liquid coolant through at least the first chamber, and flow of the second liquid coolant through at least the second chamber, such that heat is transferred from the first liquid coolant to the second liquid coolant through the thermal interface.

2. The system of claim 1, wherein the second cooling circulatory arrangement further comprises a cooling system, wherein the second cooling circulatory arrangement is configured to circulate the second liquid coolant between the second electronic device of the plurality of electronic devices, the heat exchanger and the cooling system, wherein heat is removed from the second liquid coolant by the cooling system.

3. The system of claim 1, wherein the second cooling circulatory arrangement is connected to a second liquid coolant supply, wherein the second cooling circulatory arrangement is configured to circulate the second liquid coolant received from the second liquid coolant supply between the second electronic device of the plurality of electronic devices and the heat exchanger, and to be returned to the second liquid coolant supply.

4. The system of claim 1, wherein the heat exchanger is arranged within the housing of the electronic module.

5. The system of claim 1, wherein the housing of the electronic module contains the first liquid coolant, and wherein the first electronic device is at least partially immersed in the first liquid coolant.

6. The system of claim 5, wherein the first cooling circulatory arrangement further comprises a weir, the weir comprising:
   a base and a retaining wall extending from the base, the base and retaining wall defining a volume for holding some of the first liquid coolant;
   an inlet, through which the first liquid coolant flows into the volume;
   wherein the flow of sufficient first liquid coolant through the inlet into the volume causes the first liquid coolant to overflow the retaining wall and collect with first liquid coolant contained in the housing of the electronic module and exterior the weir.

7. The system of claim 6, wherein the weir further comprises projections extending from the base and/or retaining wall within the volume of the weir.

8. The system of claim 6, wherein the weir is coupled to a surface of the first electronic device, to act as a heat sink.

9. The system of claim 1, wherein the first cooling circulatory arrangement further comprises:
   a pump configured to circulate the first liquid coolant around the first cooling circulatory arrangement.

10. The system of claim 9, wherein the first cooling circulatory arrangement further comprises a pump inlet, arranged to receive first liquid coolant contained in the housing of the electronic module and exterior the weir.

11. The system of claim 1, the second cooling circulatory arrangement further comprising a cooling module configured to thermally couple the second electronic device to the second liquid coolant.

12. The system of claim 11, wherein the cooling module comprises a cold plate, the cold plate comprising:
   a cold plate housing, a surface of the cold plate housing being arranged to provide a thermal interface for cooling the second electronic device which is thermally coupled thereto; and
   at least one channel within the cold plate housing and proximate to the surface of the cold plate housing, the at least one channel arranged for the second liquid coolant to flow therethough such that heat received from the second electronic device through the surface of the cold plate housing is transferred to the second liquid coolant.

13. The system of claim 12, the second cooling circulatory arrangement further comprising a plurality of conduits arranged to transport the second liquid coolant between the cold plate, the heat exchanger and the cooling system.

14. A method for cooling a plurality of electronic devices housed in a housing of an electronic module, the method comprising:
   circulating a first liquid coolant around a first cooling circulatory arrangement, comprising circulating a first liquid coolant between a first electronic device of the plurality of electronic devices and a heat exchanger, the first electronic device being in contact with the first liquid coolant such that heat is transferred from the first electronic device with which the first liquid coolant is in contact; and
   circulating a second liquid coolant around a second cooling circulatory arrangement, comprising circulating a second liquid coolant between a second electronic device of the plurality of electronic devices and the heat exchanger, the second electronic device being thermally coupled to the second liquid coolant such that heat is transferred from the second electronic device to the second liquid coolant;
   wherein the first cooling circulatory arrangement and the second cooling circulatory arrangement are thermally coupled at least via the heat exchanger, such that heat is transferred from the first liquid coolant to the second liquid coolant via the heat exchanger;
   wherein the heat exchanger comprises at least a first and a second chamber separated by a thermal interface, wherein the heat exchanger is configured for flow of the first liquid coolant through at least the first chamber, and flow of the second liquid coolant through at least the second chamber, such that heat is transferred from the first liquid coolant to the second liquid coolant through the thermal interface.

15. The method of claim 14, wherein the second cooling circulatory arrangement further comprises a cooling system, wherein the circulating the second liquid coolant around the second cooling circulatory arrangement comprises circulating the second liquid coolant between the second electronic device of the plurality of electronic devices, the heat exchanger and the cooling system, where heat is removed from the second liquid coolant by the cooling system.

16. The method of claim 14, wherein the second cooling circulatory arrangement further comprises a second liquid coolant supply, wherein the circulating the second liquid coolant around the second cooling circulatory arrangement comprises receiving the second liquid coolant from the second liquid coolant supply, circulating the second liquid coolant between the second electronic device of the plurality of electronic devices and the heat exchanger and to be returned to the second liquid coolant supply.

17. The method of claim 14, wherein the second cooling circulatory arrangement further comprises a cooling module, configured to thermally couple the second electronic device to the second liquid coolant.

18. The method of claim 14, wherein the cooling module comprises a cold plate, the cold plate comprising:
   a cold plate housing, a surface of the cold plate housing being arranged to provide a thermal interface for cooling the second electronic device which is thermally coupled thereto; and
at least one channel within the cold plate housing and proximate to the surface of the cold plate housing, the at least one channel arranged for the second liquid coolant to flow therethough such that heat received from the second electronic device through the surface of the cold plate housing is transferred to the second liquid coolant.

* * * * *